US011015114B2

(12) United States Patent
Budd et al.

(10) Patent No.: US 11,015,114 B2
(45) Date of Patent: *May 25, 2021

(54) ARTICLE COMPRISING PARTICLES WITH QUANTUM DOTS

(71) Applicant: 3M INNOVATIVE PROPERTIES COMPANY, St. Paul, MN (US)

(72) Inventors: Kenton D. Budd, Woodbury, MN (US); Zai-Ming Qiu, Woodbury, MN (US); Mahmut Aksit, Woodbury, MN (US); Neeraj Sharma, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 204 days.

This patent is subject to a terminal disclaimer.

(21) Appl. No.: 16/066,194

(22) PCT Filed: Dec. 28, 2016

(86) PCT No.: PCT/US2016/068780
§ 371 (c)(1),
(2) Date: Jun. 26, 2018

(87) PCT Pub. No.: WO2017/117160
PCT Pub. Date: Jul. 6, 2017

(65) Prior Publication Data
US 2019/0345379 A1 Nov. 14, 2019

Related U.S. Application Data

(60) Provisional application No. 62/273,888, filed on Dec. 31, 2015.

(51) Int. Cl.
| | |
|---|---|
| *C09K 11/02* | (2006.01) |
| *C08K 9/02* | (2006.01) |
| *C08L 81/02* | (2006.01) |
| *C08L 29/10* | (2006.01) |
| *C09K 11/70* | (2006.01) |
| *C09K 11/88* | (2006.01) |
| *H01L 33/50* | (2010.01) |
| *B82Y 20/00* | (2011.01) |

(52) U.S. Cl.
CPC .............. *C09K 11/025* (2013.01); *C08K 9/02* (2013.01); *C08L 29/10* (2013.01); *C08L 81/02* (2013.01); *C09K 11/70* (2013.01); *C09K 11/883* (2013.01); *H01L 33/502* (2013.01); *B82Y 20/00* (2013.01)

(58) Field of Classification Search
CPC .................................. C08K 9/02; C08L 81/02
See application file for complete search history.

(56) References Cited

U.S. PATENT DOCUMENTS

| | | |
|---|---|---|
| 3,317,469 A | 5/1967 | Feichtinger |
| 4,808,638 A | 2/1989 | Steinkraus |
| 5,021,512 A | 6/1991 | Woods |
| 5,080,928 A | 1/1992 | Klinedinst |
| 5,156,885 A | 10/1992 | Budd |
| 5,208,281 A | 5/1993 | Glaser |
| 5,358,976 A | 10/1994 | Dowling |
| 5,371,181 A | 12/1994 | Glaser |
| 5,399,624 A | 3/1995 | Glaser |
| 5,459,173 A | 10/1995 | Glaser |
| 5,593,795 A | 1/1997 | Chen |
| 5,876,210 A | 3/1999 | Klee |
| 5,876,805 A | 3/1999 | Ostlie |
| 5,945,464 A | 8/1999 | Takushima |
| 6,153,719 A | 11/2000 | Abbey |
| 6,369,164 B1 | 4/2002 | Klee |

(Continued)

FOREIGN PATENT DOCUMENTS

| | | |
|---|---|---|
| CN | 102690658 | 9/2012 |
| CN | 104310784 | 1/2015 |

(Continued)

OTHER PUBLICATIONS

Ciriminna, "From Molecules to Systems: Sol-Gel Microencapsulation in Silica-Based Materials", Chem. Rev. 2011, vol. 111, No. 2, pp. 765-789.
Cole, "Redox Initiation of Bulk Thiol-Ene Polymerizations", Polymer Chemistry, 2013, vol. 04, pp. 1167-1175.
Isnaeni, "Silica encapsulation of toluene soluble quantum dots with high photostability", Journal of Colloid and Interface Science, 2013, vol. 395, pp. 45-49.
Sorensen, "Fabrication of Stable Low-Density Silica Aerogels Containing Luminescent ZnS capped CdSe Quantum Dots", Advanced Material, 2006, vol. 18, pp. 1965-1967.
Kim, "In situ ligand exchange of thiol-capped CuInS2/ZnS quantum dots at growth stage without affecting luminescent characteristics", J Colloid Interface Sci, 2011, vol. 363, pp. 703-706.

(Continued)

*Primary Examiner* — Vickey Nerangis
(74) *Attorney, Agent, or Firm* — Lisa P. Fulton (57) ABSTRACT

Article comprising particles in an organic polymer matrix comprising a cured thiol-alkene resin having a $T_g > 20°$ C., wherein the particles comprise a composite core and a continuous nonmetallic inorganic coating covering the composite core, wherein the composite core comprises a nonmetallic inorganic matrix, ligands, and quantum dots, wherein the nonmetallic inorganic matrix is present in the composite core in an amount of up to 40 volume percent, and wherein the coating has an average thickness up to 5 micrometers. Exemplary articles described herein can be made for use in display applications such as films, LED caps, LED coatings, LED lenses, and light guides. Exemplary articles described herein can be made for use in nondisplay applications such as security applications where quantum dot phosphors are used to provide fluorescence at selected or tailored wavelengths. In such uses, the organic polymer matrix could be a label or a coating on a label, or other articles such as a card or tag.

14 Claims, 1 Drawing Sheet

(56) References Cited

U.S. PATENT DOCUMENTS

| | | |
|---|---|---|
| 6,468,808 B1 | 10/2002 | Nie |
| 6,506,814 B2 | 1/2003 | Krongauz |
| 6,669,873 B1 | 12/2003 | Smith |
| 7,018,713 B2 | 3/2006 | Padiyath |
| 7,037,729 B2 | 5/2006 | Nie |
| 7,226,953 B1 | 6/2007 | Petruska |
| 7,374,807 B2 | 5/2008 | Parce |
| 7,521,015 B2 | 4/2009 | Cheng |
| 7,645,397 B2 | 1/2010 | Parce |
| 7,648,845 B2 | 1/2010 | Nie |
| 7,927,515 B2 | 4/2011 | Jang |
| 8,192,673 B2 | 6/2012 | Bowman |
| 8,252,416 B2 | 8/2012 | Jun |
| 8,283,412 B2 | 10/2012 | Liu |
| 8,288,649 B2 | 10/2012 | Serban |
| 8,343,575 B2 | 1/2013 | Dubrow |
| 8,425,803 B2 | 4/2013 | Parce |
| 8,440,736 B2 | 5/2013 | Hoyle |
| 8,519,086 B2 | 8/2013 | Bowman |
| 8,592,037 B2 | 11/2013 | Parce |
| 9,778,510 B2 | 10/2017 | Won |
| 2003/0042845 A1 | 3/2003 | Pires |
| 2006/0019098 A1 | 1/2006 | Chan |
| 2006/0128826 A1 | 6/2006 | Ellison |
| 2007/0043205 A1 | 2/2007 | Dias |
| 2007/0112100 A1 | 5/2007 | Byers |
| 2007/0200479 A1 | 8/2007 | Jean |
| 2008/0213508 A1 | 9/2008 | Nagasawa |
| 2009/0059554 A1 | 3/2009 | Skipor |
| 2009/0096136 A1 | 4/2009 | Hawker |
| 2009/0294742 A1 | 12/2009 | Jang |
| 2010/0208493 A1 | 8/2010 | Choi |
| 2010/0224831 A1 | 9/2010 | Woo |
| 2011/0068322 A1 | 3/2011 | Pickett |
| 2011/0141769 A1 | 6/2011 | Lee |
| 2012/0001217 A1* | 1/2012 | Kang ............ C08L 81/02 257/98 |
| 2012/0074449 A1 | 3/2012 | Park |
| 2012/0113672 A1 | 5/2012 | Dubrow |
| 2012/0225101 A1 | 9/2012 | Kao |
| 2012/0241646 A1 | 9/2012 | Zhong |
| 2012/0270231 A1 | 10/2012 | Smith |
| 2013/0146834 A1 | 6/2013 | Cho |
| 2015/0083970 A1 | 3/2015 | Koh |
| 2015/0252234 A1 | 9/2015 | Okazaki |

FOREIGN PATENT DOCUMENTS

| | | |
|---|---|---|
| DE | 4128932 | 3/1993 |
| EP | 0824763 | 2/1998 |
| JP | 62-241924 | 10/1987 |
| JP | 62-241925 | 10/1987 |
| JP | 2007-262215 | 10/2007 |
| JP | 2010-164689 | 7/2010 |
| JP | 2011-162691 | 8/2011 |
| KR | 2011-122455 | 11/2011 |
| KR | 2015-070667 | 6/2015 |
| WO | WO 2000/029617 | 5/2000 |
| WO | WO 2001/044377 | 6/2001 |
| WO | WO 2008/005561 | 1/2008 |
| WO | WO 2008/140495 | 11/2008 |
| WO | WO 2009-36373 | 9/2009 |
| WO | WO 2009/136824 | 11/2009 |
| WO | WO 2009/137197 | 11/2009 |
| WO | WO 2010/052455 | 5/2010 |
| WO | WO 2010/120422 | 10/2010 |
| WO | WO 2012/042059 | 4/2012 |
| WO | WO 2012/126695 | 9/2012 |
| WO | WO 2012/163078 | 12/2012 |
| WO | WO 2013/021494 | 2/2013 |
| WO | WO 2013/078309 | 5/2013 |
| WO | WO 2013-191964 | 12/2013 |
| WO | Wo 2014-113562 | 7/2014 |
| WO | WO 2014-147570 | 9/2014 |
| WO | WO 2015-102967 | 7/2015 |
| WO | WO 2015/187490 | 12/2015 |
| WO | WO 2016-081219 | 5/2016 |
| WO | WO 2016-167927 | 10/2016 |
| WO | WO 2016-168048 | 10/2016 |
| WO | WO 2017/030857 | 2/2017 |
| WO | WO 2017-116820 | 7/2017 |
| WO | WO 2017-117162 | 7/2017 |
| WO | WO 2017-200824 | 11/2017 |

OTHER PUBLICATIONS

Pong, "Modified Ligand-Exchange for Efficient Solubilization of CdSe/ZnS Quantum Dots in Water: A Procedure Guided by Computational Studies", Langmuir, 2008, vol. 24, No. 10, pp. 5270-5276.

Luan, "Mercaptopropionic acid capped CdSe/ZnS quantum dots as fluorescence probe for lead(II)", J. Nanopart Res, 2012, vol. 14;762, pp. 1-8.

Denayer, "Low-coverage adsorption properties of the metal-organic framework", May 14, 2009, PCCP, vol. 11, No. 18, p. 3325.

Wang, "Surface Modification of CdSe and CdSe/ZnS Semiconductor Nanocrystals with Poly (N,N-dimethylaminoethyl methacrylate)", Macromolecules, 2006, vol. 39, pp. 3664-3672.

Hoyle, "Thiol-Enes: Chemistry of the Past with Promise for the Future", Journal of Polymer Science, 2004, vol. 42, pp. 5301-5338.

Simic, "Gas barrier and adhesion of interpenetrating polymer networks based on poly(diurethane bismethacrylate) and different epoxy amine networks", European Polymer Journal, 2002, vol. 38, pp. 2449-2458.

Moon, "Phosphor concentration and geometry for high power white light emitting diode," Light-Emitting Diodes: Materials, Devices, and Applications for Solid State Lighting, 2010 vol. 7617, No. XIV, SPIE, pp. 76171Y-1-76171Y-8.

Massadeh, "Synthesis and exploitation of InP/ZnS quantum dots for bioimaging", Proceedings of SPIE, 2009, vol. 7189, pp. 718902-1-718902-11.

Freitas, "Connecting the (quantum) dots: towards hybrid photovoltaic devices based on chalcogenide gels", Phys. Chem. Chem. Phys., 2012, vol. 14, pp. 15180-15184.

Song, "Encapsulation of CdSe/ZnS nanocrystals within mesoporous silica spheres", Materials Research Bulletin, 2013, vol. 48, pp. 1530-1535.

* cited by examiner

ARTICLE COMPRISING PARTICLES WITH QUANTUM DOTS

CROSS REFERENCE TO RELATED APPLICATION

This application claims the benefit of U.S. Provisional Patent Application No. 62/273,888, filed Dec. 31, 2015, the disclosure of which is incorporated by reference herein in its entirety.

BACKGROUND

Light emitting semiconductor nanoparticles (also known as "quantum dots") such as CdSe or InP are useful as phosphor materials. Uses of quantum dots include backlights for liquid crystal displays (LCD). Light from short wavelength light emitting diodes (LED) is converted to desired visible wavelengths by the quantum dots. For example, a backlight can comprise blue emitting LEDs, and red and green emitting quantum dots that adsorb part of the blue light. Quantum dots can be used to create narrow emission peaks, resulting in displays with high color gamut. 3M Company markets a remote phosphor diffuser film product (QDEF) (quantum dot enhancement film) using quantum dot emitters. The quantum dots in this product are embedded in a polymer matrix, which is sandwiched between two sheets of high barrier film to protect the quantum dots from atmospheric components such as oxygen and water vapor. Each sheet of high barrier film has a high barrier thin film metal oxide coating.

SUMMARY

In one aspect, the present disclosure describes an article comprising particles in an organic polymer matrix comprising a cured thiol-alkene resin having a $T_g$ greater than 20° C. (in some embodiments, greater than 25° C., or even greater than 30° C.; in a range from 20° C. to 120° C.), wherein the particles comprise a composite core and a continuous nonmetallic inorganic coating (e.g., nonoptically absorbing material that absorbs less than 20% of the light energy (i.e., wavelength in the range from 460 nm to 720 nm) emitted by the quantum dots) covering the composite core, wherein the composite core comprises a nonmetallic inorganic matrix, ligands, and quantum dots, wherein the nonmetallic inorganic matrix is present in the composite core in an amount of up to 40 (in some embodiments, up to 35, 30, 25, or even up to 20; in some embodiments, in a range from 5 to 40, 5 to 30, or even 5 to 20) volume percent, and wherein the coating has an average thickness up to 5 micrometers (in some embodiments, up to 4 micrometers, 3 micrometers, 2 micrometers, 1 micrometer, 750 nm, 500 nm, 250 nm, 100 nm, or even up to 50 nm; in some embodiments, in a range from 5 nm to 500 nm, 10 nm to 500 nm, or even 25 nm to 500 nm).

In another aspect, the present disclosure provides a curable composition comprising at least one polythiol, at least one polyalkene, and particles, wherein the particles comprise a composite core and a continuous nonmetallic inorganic coating (e.g., nonoptically absorbing material that absorbs less than 20% of the light energy (i.e., wavelength in the range from 460 nm to 720 nm) emitted by the quantum dots) covering the composite core, wherein the composite core comprises a nonmetallic inorganic matrix, ligands, and quantum dots, wherein the nonmetallic inorganic matrix is present in the composite core in an amount of up to 40 (in some embodiments, up to 35, 30, 25, or even up to 20; in some embodiments, in a range from 5 to 40, 5 to 30, or even 5 to 20) volume percent, and wherein the coating has an average thickness up to 5 micrometers (in some embodiments, up to 4 micrometers, 3 micrometers, 2 micrometers, 1 micrometer, 750 nm, 500 nm, 250 nm, 100 nm, or even up to 50 nm; in some embodiments, in a range from 5 nm to 500 nm, 10 nm to 500 nm, or even 25 nm to 500 nm).

In some embodiments, the thiol-alkene polymer matrix is the cured reaction product of at least one polythiol and at least one polyalkene (polyalkenyl compound), wherein the functionality of both the polythiol and the polyalkene is at least 2 (in some embodiments, in which has a functionality of greater than 2).

As used herein:

"Thiol-alkene" refers to the un-cured or cured reaction mixture of at least one polythiol having at least two thiol (—SH) groups and at least one polyalkene compound having at least two alkenyl groups (or carbon-carbon double bond), wherein the polyalkene excludes from polyacrylate monomers and polymethacrylate monomers even though a small part of them (such as less than 20% by weight) may be blended with the polyalkene;

"alkyl" means a linear or branched, cyclic or acylic, saturated monovalent hydrocarbon;

"alkylene" means a linear or branched unsaturated divalent hydrocarbon;

"alkenyl" means a linear or branched unsaturated hydrocarbon;

"aryl" means a monovalent aromatic (e.g., phenyl and naphthyl);

"arylene" means a polyvalent, aromatic (e.g., phenylene and naphthalene); and

"aralkylene" means a group defined above with an aryl group attached to the alkylene (e.g., benzyl and 1-naphthylethyl).

"(Hetero)hydrocarbyl" is inclusive of hydrocarbyl alkyl and aryl groups, and (hetero)hydrocarbyl heteroalkyl and heteroaryl groups, the later comprising at least one catenary (in-chain) heteroatoms such as ether or amino groups. (Hetero)hydrocarbyl may optionally contain at least one catenary (in-chain) functional groups including ester, amide, urea, urethane, and carbonate functional groups. Unless otherwise indicated, the nonpolymeric (hetero)hydrocarbyl groups typically contain from 1 to 60 carbon atoms. Some examples of such (hetero)hydrocarbyls as used herein include methoxy, ethoxy, propoxy, 4-diphenylaminobutyl, 2-(2'-phenoxyethoxy)ethyl, 3,6-dioxaheptyl, 3,6-dioxahexyl-6-phenyl, in addition to those described for "alkyl", "heteroalkyl", and "aryl" supra.

"Hydrophobic" means a surface that is energetically unfavorable (i.e., it takes energy), to spread water on the surface. A bulk smooth surface of a hydrophobic material will have a contact angle greater than 90 degrees. Such properties are known in the art, and are associated with surfaces having certain chemical elements known to impart hydrophobicity (so called hydrophobic groups). A hydrophobic porous material will not absorb water by infiltration.

The words or terms "comprises" and "includes," and variations thereof, do not have a limiting meaning where these terms appear in the description and claims. Such terms will be understood to imply the inclusion of a stated step or element or group of steps or elements but not the exclusion of any other step or element or group of steps or elements. By "consisting of" is meant including, and limited to, whatever follows the phrase "consisting of" Thus, the phrase "consisting of" indicates that the listed elements are required or mandatory, and that no other elements may be present. By "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they materially affect the activity or action of the listed elements.

The words "preferred" and "preferably" refer to claims of the disclosure that may afford certain benefits, under certain circumstances. However, other claims may also be preferred, under the same or other circumstances. Furthermore, the recitation of one or more preferred claims does not imply that other claims are not useful, and is not intended to exclude other claims from the scope of the disclosure.

The terms such as "a," "an," and "the" are not intended to refer to only a singular entity, but include the general class of which a specific example may be used for illustration. The terms "a," "an," and "the" are used interchangeably with the term "at least one." The phrases "at least one of" and "includes at least one of" followed by a list refers to any one of the items in the list and any combination of two or more items in the list.

The term "or" is generally employed in its usual sense including "and/or" unless the content clearly dictates otherwise.

The term "and/or" means one or all of the listed elements or a combination of any two or more of the listed elements.

All numbers are assumed to be modified by the term "about" and in certain embodiments, preferably, by the term "exactly." As used herein in connection with a measured quantity, the term "about" refers to that variation in the measured quantity as would be expected by the skilled artisan making the measurement and exercising a level of care commensurate with the objective of the measurement and the precision of the measuring equipment used.

Herein, "up to" a number (e.g., up to 50) includes the number (e.g., 50).

The recitations of numerical ranges by endpoints include all numbers subsumed within that range as well as the endpoints (e.g., 1 to 5 includes 1, 1.5, 2, 2.75, 3, 3.80, 4, 5, etc.).

As used herein, the term "room temperature" refers to a temperature of 20° C. to 25° C. or 22° C. to 25° C.

The above summary of the present disclosure is not intended to describe each disclosed embodiment or every implementation of the present disclosure. The description that follows more particularly exemplifies the illustrative embodiments. In several places throughout the application, guidance is provided through lists of examples, which examples may be used in various combinations. In each instance, the recited list serves only as a representative group and should not be interpreted as an exclusive list.

In some embodiments, articles comprising the particles and a thiol-alkene polymer matrix have air stable light emission properties (i.e., has at least an emission intensity after 1000 hours of at least 70% (in some embodiments, at least 80%, or even at least 90%) of the peak emission intensity as determined by the Ambient Life Test in the Examples), and also exhibit high stability in ambient and 85° C. storage tests described in the Examples.

The encapsulated particles typically provide high levels of stability (e.g., little or no loss of emission efficiency) during operation (photoluminescence) of corresponding articles. For example, films can typically be made without the use of high barrier substrates, and none the less exhibit high stability regardless of the organic polymer matrix material used. Surprisingly, however, degradation in storage can occur even for articles (e.g., films) that exhibit very high stability in operation. It has been found that articles comprising a thiol-alkene polymer matrix, in combination with encapsulated particles described herein, exhibit greatly improved storage stability.

Exemplary articles described herein can be made for use in display applications such as films, LED caps, LED coatings, LED lenses, and light guides. Exemplary articles described herein can be made for use in nondisplay applications such as security applications where quantum dot phosphors are used to provide fluorescence at selected or tailored wavelengths. In such uses, the organic polymer matrix could be a label or a coating on a label, or other articles such as a card or tag.

DETAILED DESCRIPTION

The present disclosure describes an article comprising particles in an organic polymer matrix comprising a cured thiol-alkene resin having a $T_g$ greater than 20° C. (in some embodiments, greater than 25° C., or even greater than 30° C.; in a range from 20° C. to 120° C.), wherein the particles comprise a composite core and a continuous nonmetallic inorganic coating (e.g., nonoptically absorbing material that absorbs less than 20% of the light energy (i.e., wavelength in the range from 460 nm to 720 nm) emitted by the quantum dots) covering the composite core, wherein the composite core comprises a nonmetallic inorganic matrix, ligands, and quantum dots, wherein the nonmetallic inorganic matrix is present in the composite core in an amount of up to 40 (in some embodiments, up to 35, 30, 25, or even up to 20; in some embodiments, in a range from 5 to 40, 5 to 30, or even 5 to 20) volume percent, and wherein the coating has an average thickness up to 5 micrometers (in some embodiments, up to 4 micrometers, 3 micrometers, 2 micrometers, 1 micrometer, 750 nm, 500 nm, 250 nm, 100 nm, or even up to 50 nm; in some embodiments, in a range from 5 nm to 500 nm, 10 nm to 500 nm, or even 25 nm to 500 nm).

Figure 1:
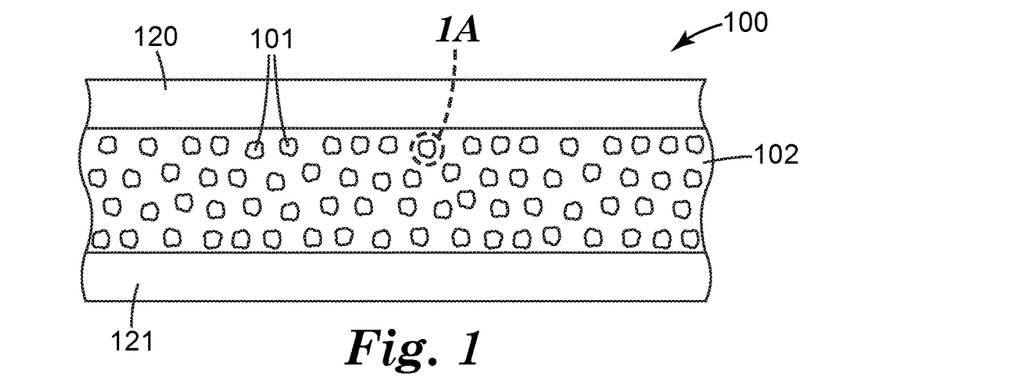
FIG. 1 is a cross-sectional view of an exemplary article described herein.
Figure 1A:
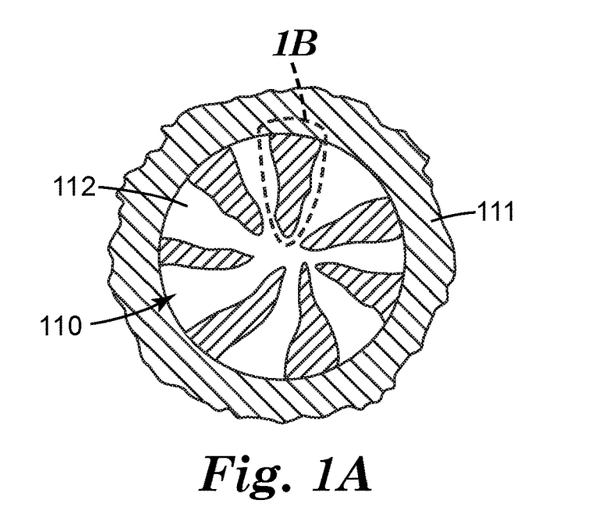
FIG. 1A is a cross-sectional view of an exemplary particle shown in FIG. 1.
Figure 1B:
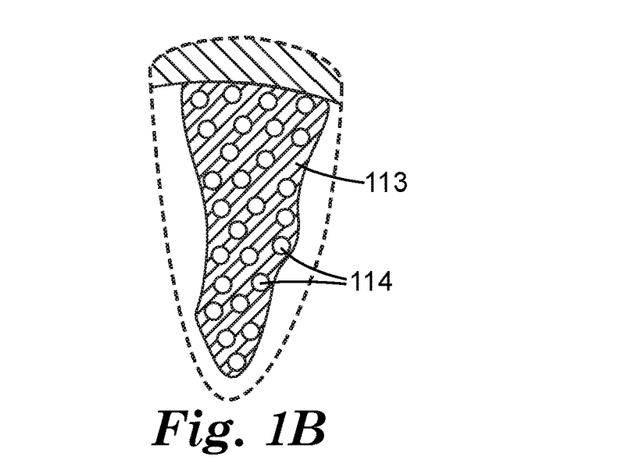
FIG. 1B is a cross-sectional view of a portion of the exemplary particle shown in FIG. 1A showing further detail.

Referring to FIGS. 1, 1A, and 1B, article 100 comprises particles described herein, 101 inorganic polymer matrix 102. As shown, particles 101 and organic polymer matrix 102 are disposed between substrates 120, 121. Particles 101 have composite cores 110 and continuous nonmetallic inorganic coatings 111. Composite cores 110 have nonmetallic inorganic matrices 112, ligands 113, and quantum dots 114.

In general, the particles described herein can be made by a method comprising:
providing a liquid having quantum dots dispersed therein;
infiltrating the liquid having the quantum dots into a porous nonmetallic inorganic particle; and
encapsulating the infiltrated particle with a continuous nonmetallic inorganic (e.g., nonoptically absorbing) coating to provide a particle described herein. In some embodiments, the liquid having quantum dots dispersed therein comprises up to 50 (in some embodiments, up to 45, 40, 35, 30, or up to 25; in some embodiments, in a range from 5 to 30, 5 to 25, or even 10 to 20) weight percent quantum dots.

In some embodiments, encapsulating the infiltrated particle with a continuous nonmetallic inorganic coating is done via at least one of vapor deposition (including chemical vapor deposition (CVD) (including atmospheric pressure chemical vapor deposition (APCVD), hydrolysis (CVD), and plasma CVD))), atomic layer deposition (ALD), sputtering, or evaporation, which are techniques well known in the art.

Advantages of vapor deposition techniques for providing the coatings include that the coating is built up from molecular size species without interference from a solvent or liquid media. Some coating methods (e.g., ALD and CVD) tend to provide coatings composed of conformal layers on irregular materials (e.g., powder or porous particulate).

ALD and CVD are coating processes involving chemical reactions, where the chemical reactants used are referred to as chemical precursors. That is, they are precursors to the coating material (i.e., coating precursors) to be formed (e.g., a metal oxide coating). In some embodiments, a single coating precursor is used, while in other embodiments, at least two coating precursors are used. At least one coating precursor comprises at least one metal cation needed for the coating (e.g., a metal oxide coating).

A single coating precursor may be used when simple decomposition of the precursor (e.g., thermal decomposition or plasma enhanced decomposition) is sufficient to form a coating. At least two coating precursors (e.g., metal oxide precursors) are used when at least one coating precursor comprises at least one metal cation and chemically reacts with at least one additional precursor (i.e., a co-reactant) to form a coating (e.g., a metal oxide coating). The additional coating precursor is a co-reactant to the coating precursor comprising at least one metal cation. A co-reactant(s) chemically reacts with a coating precursor comprising at least one metal cation to form a coating.

ALD coatings are generally deposited one monolayer at a time via alternate pulses of a chemical precursor (e.g., a coating precursor comprising at least one metal cation), absorption of a monolayer of the precursor, removal of excess precursor, and pulsing of a co-reactant (e.g., a co-reactant to the coating precursor comprising at least one metal cation). As such, these coatings tend to be conformal and uniform. Alternatively, for example, ALD systems can also deposit thicker, non-self-limiting coatings wherein significantly greater than a monolayer of each chemical reactant adsorbs into a substrate during each pulse or cycle, and results in the deposition of much larger amounts of coating.

CVD coatings can involve similar chemical reactions, but both precursors are typically supplied concurrently and continuously. Uniformity can be enhanced with continuous mixing of a powder being coated. Fabrication of composite particles having high photoluminescent efficiency requires process methods and conditions that do not damage the quantum dot particles.

A particularly effective coating method for making particles described herein is APCVD. APCVD can be carried out in simple equipment such as glassware. In some embodiments, hydrolysis reactions are used to form metal oxide coatings at moderate temperatures (e.g., 100° C. to 130° C.), although some hydrolysis reactions are carried out at slightly higher temperatures as well (e.g., 130° C.-220° C.). In addition, atmosphere pressure conditions, in combination with nanoporous core materials, can be effective in maintaining liquid within the composite particles, and protecting quantum dots within the particles from reacting with air, precursors, or reaction products associated with the CVD process. APCVD facilitates making particles described herein containing volatile liquids (i.e., liquids that otherwise would be volatized and hence removed when exposed to a vacuum environment associated with some other processes). Exemplary precursors for ALD and CVD processes include coating precursors (e.g., metal oxide precursors) comprising at least one metal cation such as metal alkyls (e.g., trimethyl or triethyl aluminum, and/or diethyl zinc), volatile metal chlorides (titanium tetrachloride, silicon tetrachloride, and/or aluminum trichloride), silane, metal alkoxides (titanium isopropoxide, aluminum isopropoxide, and/or silicon ethoxide), compounds with mixed alkyl, halide, hydride, alkoxy, and other groups, and other volatile metallorganic compounds. Exemplary co-reactants to the coating precursor comprising at least one metal cation (e.g., a metal oxide precursor comprising at least one metal cation) include water, oxygen, ozone, ammonia, and alkyl amines. In addition to metal oxides, other nonmetallic inorganic coating materials are deposited using chemical reactions between a coating precursor and a co-reactant to the coating precursor (e.g., a metal nitride coating deposited using a metal nitride precursor comprising at least one metal cation and a co-reactant to the metal nitride precursor).

In some embodiments, encapsulating the infiltrated particle with a continuous coating is done via a CVD carried out at a temperature(s) at less than 150° C. (in some embodiments, less than 125° C.). In some embodiments, encapsulating the infiltrated particle with a continuous coating is done via CVD not exceeding a temperature of 200° C.

In some embodiments, encapsulating the infiltrated particle with the nonmetallic inorganic high barrier coating is done at a pressure of at least 0.5 atmosphere.

Exemplary continuous coatings comprise, for example, nonmetallic inorganic materials such as silica, metal (e.g., Al, Si, Ti, Zr, Mg, and Zn) oxides, metal nitrides, metal sulfides, metal oxysulfides, and metal oxynitrides. Exemplary metal oxides include forms such as hydroxides, and hydrous oxides, as well as forms with mixed anions (e.g., oxide plus halides, hydroxyls, small amounts of alkyls or carboxylates, etc.). The coatings can be amorphous, crystalline, or mixed; single or multiphase; and can contain one or more cations and one or more anions. In some embodiments, the coating is amorphous alumina with or without some hydroxyls or bound water.

In some embodiments, encapsulating the infiltrated particle with a continuous coating is done via an APCVD coating process, wherein an alumina based coating is provided using trimethyl aluminum (TMA) and water. Precursors can be introduced into a reaction chamber by flowing a carrier gas through a bubbler of each liquid precursor. Generally, as is typical for CVD processes, the carrier gases with each component are delivered concurrently and continuously into the reaction chamber. Desirable flow rates and ratios can be adjusted to produce desired amounts and characteristics of coatings. In some embodiments, flows of either precursor can be initiated or maintained individually for a period of time wherein no flow of the other precursor is present. In some embodiments, the flows of precursors can be changed or adjusted one or more times throughout a process. Such changes can enable favorable usage of conditions which are least harmful to quantum dot properties, and other conditions which provide more desirable coating characteristics when such conditions conflict.

In some embodiments, the ratio of a co-reactant (e.g., water) to a coating precursor comprising at least one metal cation (e.g., TMA) is higher initially than later in a process.

In other embodiments, the ratio of a co-reactant (e.g., water) to a coating precursor comprising at least one metal cation is lower initially than later in a process. In some embodiments, composite particles are exposed to only a co-reactant (e.g., water) for an initial period prior to exposure to a coating precursor comprising at least one metal cation. In some embodiments, composite particles are exposed to only a coating precursor comprising at least one metal cation prior to exposure to a second reactant (e.g., a co-reactant to the coating precursor). Surprisingly, both the efficiency and the air stability of composite particles can be significantly improved using such initial exposures. In some embodiments, different flow conditions are maintained for at least 5 minutes (or in other embodiments, at least 10, 15, 20, 30, 45, 60, or 90 minutes).

In some embodiments, a coating of a first composition is deposited, followed by a coating of a second composition. For example, an alumina based coating can be deposited from TMA and water, followed by a titania based coating deposited from $TiCl_4$ and water.

Quantum dots are commercially available, for example, from Nanosys, Inc., Milpitas, Calif., and are typically provided with the quantum dots in a liquid (e.g., a solvent such as toluene, or a liquid ligand system). In some embodiments, the quantum dots comprise at least one of ZnS, ZnSe, CdS, CdSe, PbS, InP, InAs, GaAs, GaP, Si, or Ge. In some embodiments, the quantum dots comprise CdSe or InP nanoparticles. Typically, the quantum dots comprise so-called core-shell structures, with a core of the desired semiconductor nanoparticle, and at least one shell of additional material that provides desired stability and surface chemical or electronic properties. Exemplary materials include CdSe core-CdS intermediate layer. In one embodiment, the quantum dots have a CdSe core, a ZnSe middle layer, and a ZnS shell. In another embodiment, the structure is an InP core-ZnSe intermediate-ZnS shell. It is to be understood there is a distinct difference between the core of a quantum dot (typically less than 4 nm in diameter), and the core region of the composite particles described herein (typically at least micrometers or tens of micrometers in diameter).

In some embodiments, porous nonmetallic inorganic particles useful for making the composite core of the particles that are in the organic polymer matrix comprise pores and nonmetallic inorganic matrix. The nonmetallic inorganic matrix comprises at least one of silica, metal (e.g., Al, Ti, Zr, Mg, and Zn) oxide, metal nitride, metal sulfide, metal oxysulfide, or metal oxynitride. Exemplary metal oxides include forms such as hydroxides, hydrous oxides, and as well as forms with mixed anions (e.g., oxide plus halides, hydroxyls, small amounts of alkyls or carboxylates, etc.). The porous nonmetallic inorganic particle and the nonmetallic inorganic matrix of the core particles can be amorphous, crystalline, or mixed, single or multiphase, and can contain one or more cations and one or more anions, mixed oxides, hydrous oxides. The porous nonmetallic inorganic particles can be made by techniques known in the art. For example, chemically derived porous metal oxide particles can be made by growth from alkoxide solutions or nanoparticle sols. Exemplary methods also include emulsion processes, or atomization of aqueous chemical precursors into oils or gelling media (see, e.g., "From Molecules to Systems: Sol-Gel Microencapsulation in Silica-Based Materials," Rosaria Ciriminna, Marzia Sciortino, Giuseppe Alonzo, Aster de Schrijver, and Mario Pagliaro, *Chem. Rev.*, 2011, 111 (2), pp 765-789). Dried chemically derived particles are sometimes called xerogels. Xerogel particles can be heated to remove residual solvents and organics, but should be processed at temperatures such that sufficient sintering does not occur to eliminate desired porosity.

In some embodiments, the porous nonmetallic inorganic particles are aerogel granules. Aerogels have very high pore volume (e.g., 60%-95%) and very fine pores (e.g., 5 nm-100 nm in diameter). Aerogels are formed by processing gels so as to remove solvent without inducing shrinkage or collapse of the structure as would normally occur due to surface tension forces. The surfaces of aerogels may be treated with a desired functionality (e.g., a hydrophobic functional group). Pre-formed porous particles (e.g., pre-formed aerogels) provide the advantage of not exposing quantum dots to the aerogel synthesis process. Other useful pre-formed porous particles include those known in the art, for example, as chromatography media.

Porous nonmetallic inorganic particles can be formed by techniques known in the art. For example, fine powders of desired materials can be formed into agglomerate particles (e.g., by spray drying), and partially sintered to yield porous particles.

In some embodiments, the nonmetallic inorganic matrix is present in a porous nonmetallic inorganic particle in an amount of up to 40 (in some embodiments, up to 35, 30, 25, or even up to 20; in some embodiments, in a range from 5 to 40, 5 to 30, or even 5 to 20) volume percent.

In some embodiments, the nonmetallic inorganic matrix has a hydrophobic surface. The surface of the nonmetallic inorganic matrix can be made hydrophobic, for example, by treatment with a silane or other agent with a hydrophobic group. Hydrophobic groups include, for example, a variety of hydrocarbon and fluorocarbon groups such as simple alkyl groups (dimethyl, trimethyl, diethyl, triethyl), long chain alkanes such as $C_8$ (octane), and $C_{18}$ (octadecyl), fluoromaterials such as tetrafluoroethylene, alkenes such as propylene, and mixed groups such as heptadecafluorodecyl.

In some embodiments, the surface of a nonmetallic inorganic matrix is untreated, with neutral, or hydrophilic characteristics.

In some embodiments, the porous nonmetallic inorganic particles (prior to filling with quantum dots and ligand systems) are greater than 50 (in some embodiments, at least 55, 60, 70, or even at least 75; in some embodiments, in a range from 50 to 75, or even 60 to 90) volume percent porous. In some embodiments, the porous nonmetallic inorganic particles comprise a mesoporous structure. In some embodiments, the porous nonmetallic inorganic particles have an average pore size, if components of the composite core other than the nonmetallic inorganic matrix were not present, of not greater than 250 nm (in some embodiments, not greater than 200 nm, 150 nm, 100 nm, 75 nm, 50 nm, 25 nm, or even not greater than 10 nm; in some embodiments, in a range from 5 nm to 250 nm, 5 nm to 200 nm, 5 nm to 150 nm, 5 nm to 100 nm, 5 nm to 75 nm, 5 nm to 50 nm, 5 nm to 25 nm, or even 10 nm to 100 nm).

Quantum dots (light emitting semiconductor nanoparticles) typically have selected molecules, oligomers, or polymers having optimized functional groups bound to their surfaces, resulting in a desirable local ligand environment for atoms at the surfaces of the quantum dots. Generally, certain ligands are present during the growth process used to synthesize the quantum dots. Often, these ligands are replaced or exchanged at a later time to provide a new ligand environment selected to optimize properties. Ligands perform several functions. They help prevent quantum dots from clustering and quenching, they can improve the chemical stability of the quantum dot surface, and they can improve the emission efficiency of the quantum dots. Ligand systems can include several forms. In general, they can include molecules or functional groups directly bound to quantum dots, and optionally, additional material. The additional material can be liquid or solid, and can be the same composition or a different composition compared to the bound material (e.g., a ligand system could comprise a bound species and a solvent).

An example of a ligand system for CdSe-based quantum dots is a liquid aminosilicone type oil with both bound material and additional material of similar composition. An example of a ligand system for InP-based quantum dots is bound medium chain carboxylic acid species with a solid polymer (e.g., isobornyl methacrylate) as an additional material, or with carboxylate groups in the polymer (e.g., copolymer of isobornyl methacrylate and methacrylic acid) bonded to the quantum dots as well. Composite particles described herein can be advantageous in that they can maintain a desirable ligand environment, including an environment comprising a liquid ligand system or solvent. Surprisingly, even when a particle core is greater than 50 volume % liquid, confinement within a nanoporous nonmetallic inorganic matrix can enable deposition of a high barrier nonmetallic inorganic thin film coating directly onto the liquid filled core. Exemplary desirable properties of ligand systems for composite particles and processes include stability at process temperatures and favorable infiltration behavior. Surprisingly, CdSe-based quantum dots in an aminosilicone oil ligand system infiltrate readily into both hydrophobic treated porous silica particles and untreated hydrophilic silica particles. In addition, these materials have been found to be stable to process temperatures of at least 200° C.

In some embodiments, the ligand system can be a liquid at the time of infiltration, and subsequently converted to a solid by curing, polymerization, or solvent removal. In some embodiments, the ligands include at least one organic, organometallic, or polymeric ligand. Suitable ligands include polymers, glassy polymers, silicones, carboxylic acid, dicarboxylic acid, poly-carboxylic acid, acrylic acid, phosphonic acid, phosphonate, phosphine, phosphine oxide, sulfur, amines, amines which combine with epoxides to form an epoxy, monomers of any of the polymeric ligands mentioned herein, or any suitable combination of these materials. The quantum dot ligands can include amine-containing organic polymers such as aminosilicone (AMS) (available, for example, under the trade designations "AMS-242" and "AMS-233" from Gelest, Morrisville, Pa.), and "GP-998" (from Genesee Polymers Corp., Burton, Mich.); and polyether amines (available, for example, under the trade designation "JEFFAMINE" from Huntsman Corporation, The Woodlands, Tex.).

Suitable ligands include ligands having at least one quantum dot-binding moietie (e.g., an amine moiety or a dicarboxylic acid moiety). Exemplary amine ligands include aliphatic amines (e.g., decylamine or octylamine, and polymeric amines).

Nonvolatile liquid ligands comprise sufficiently high molecular weight liquid versions of the chemistries described above. Typically, liquid ligands comprising monomers or polymers having chemical backbones of at least about eight units long, or chemical species with carbon chains of about eight units or more, and having little or no additional shorter chain volatile solvents, provide nonvolatile ligand systems. Examples of nonvolatile liquid ligand systems include any of the aminosilicone materials listed above, $C_8$ compounds (e.g., isooctyl acrylate and isooctyl methacrylate, trioctyl phosphate, and dioctyl phosphonate), fluorocarbons and fluoropolymers (e.g., hexafluoropropylene oxide), and poly-ether amine (available, for example, under the trade designation "JEFFAMINE" from Huntsman Corporation).

The liquid that is infiltrated into the porous nonmetallic inorganic particles can comprise a liquid ligand system with both bound and unbound ligands, additional solvents, other dissolved components such as organic polymers, quantum dots, and other components (e.g., monomers or surfactants).

Infiltration of a liquid containing quantum dots into a porous nonmetallic inorganic matrix can be done by mixing particles or granules of porous nonmetallic inorganic matrix material with the liquid. In some embodiments, the volume of liquid is chosen to be a large fraction of the available pore volume (e.g., the volume of liquid is 50 to 99% of the pore volume). In some embodiments, wherein the quantum dots are in a viscous liquid ligand system, a solvent can be used to facilitate infiltration. Optionally, the solvent can be removed by, for example, vacuum drying, following infiltration. In some embodiments, the nonmetallic inorganic matrix material can be chosen or designed such that some shrinking occurs during drying, resulting in a composite particle with a high fill fraction.

In some embodiments, grinding is desirable after infiltration. Grinding can be done using common grinding or milling methods in an inert atmosphere.

In some embodiments, collectively the ligands and the quantum dots are present in the composite core in an amount of at least 60 (in some embodiments, at least 65, 70, 75, 80, 85, or even at least 90; in some embodiments, in a range from 60 to 95, or even 70 to 95) volume percent.

In some embodiments, the composite core further comprises a liquid (e.g., a nonvolatile liquid ligand system such as aminosilicone oil). In some embodiments, collectively the liquid, the ligands, and the quantum dots are present in the composite core in an amount greater than 50 (in some embodiments, at least 55, 60, 70, or even at least 75; in some embodiments, in a range from 50 to 75, or even 60 to 95) volume percent. In some embodiments, the quantum dots, the ligands, and the liquid are in the form of a liquid-ligand system.

The liquid is understood to be a liquid material comprising the quantum dots, ligands bound to the quantum dots, and additional materials that are part of or within the liquid. The additional materials can comprise, for example, unbound ligands, solvents, dissolved solids (materials that are solids when separated from and not dissolved in a liquid), and other dissolved or dispersed liquid components (e.g., solvents, liquid monomers, liquid organic polymers, and oils).

In some embodiments, the ligands include at least one of an amine functional silicone, a carboxylic acid functional silicone, a bound ligand plus a solvent or carrier liquid, and a curable component.

In some embodiments, the composite core further comprises an organic polymer. In some embodiments, the organic polymer is at least one of an acrylate or an epoxy. In some embodiments, collectively the liquid, the ligands, the organic polymer, and the quantum dots are present in the composite core in an amount greater than 50 (in some embodiments, at least 55, 60, 70, or even at least 75; in some embodiments, in a range from 50 to 75, or even 60 to 95) volume percent.

In some embodiments, the coating comprises at least one form selected from the group consisting of amorphous, crystalline, hydroxide, hydrous oxide, anhydrous oxide, and combinations thereof. In some embodiments, the coating comprises at least one oxide comprising at least one of Al, Si, Ti, Zr, or Mg.

In some embodiments, the nonmetallic inorganic high barrier coating has an average thickness up to 5 micrometers (in some embodiments, up to 4 micrometers, 3 micrometers, 2 micrometers, 1 micrometer, 750 nm, 500 nm, 250 nm, 100 nm, or even up to 50 nm; in some embodiments, in a range from 5 nm to 500 nm, 10 nm to 500 nm, or even 25 nm to 500 nm). In some embodiments, the coating at least partially penetrates into the composite core.

In some embodiments, the particle has air stable photoluminescent efficiency (i.e., has an external quantum efficiency after 1000 hours of at least 70% (in some embodiments, at least 80% or even at least 90%) of the peak external quantum efficiency as determined by the Ambient Life Test in the Examples in combination with an external quantum efficiency measurement, as described in the Examples taken at time zero and taken or inferred after 1000 airs of excitation). In some embodiments, the particle has air stable photoluminescent emission (i.e., has an emission intensity after 1000 hours of at least 70% (in some embodiments, at least 80% or even at least 90%) of the peak emission intensity as determined by the Ambient Life Test in the Examples).

In some embodiments, the particles described herein are in a range from 10 micrometers to 100 micrometers (in some embodiments, in a range from 20 micrometers to 50 micrometers).

The cured thiol-alkene polymer matrix or binder is the cured reaction product of at least one polythiol and at least one polyalkene (polyalkenyl compound), wherein the functionality of both the polythiol and the polyalkene is at least 2 (in some embodiments, at least one of which has a functionality of greater than 2). In some embodiments, both the polythiol and polyalkene have a functionality of >2.

The polythiol reactant in the thiol-alkene resin is of the formula:

$$R^2(SH)_y, \quad \quad \quad \quad \text{I}$$

wherein $R^2$ is a (hetero)hydrocarbyl group having a valence of y, where y is ≥2 (in some embodiments, y is >2). The thiol groups of the polythiols may be primary or secondary. The compounds of Formula I may include a mixture of polythiol compounds having an average functionality of at least two. $R^2$ includes any (hetero)hydrocarbyl groups, including aliphatic and aromatic polythiols. $R^2$ may optionally further include at least one functional group including pendent hydroxyl, acid, ester, or cyano groups or catenary (in-chain) ether, urea, urethane and ester groups.

In some embodiments, $R^2$ comprises aliphatic or cycloaliphatic moiety having from 1 to 30 carbon atoms. In another embodiment, $R^2$ is oligomeric moiety derived from carbon-carbon double bonds, polyisocyanurates, polycarboxylic acids or polyols having pendent or terminal reactive —SH groups. In another embodiment, $R^2$ is polymeric and comprises a polyoxyalkylene, polyester, polyolefin, polyacrylate, or polysiloxane polymer having pendent or terminal reactive —SH groups. Useful oligomers and polymers include, for example, thiol-terminated polyethylenes or polypropylenes, and thiol-terminated poly(alkylene oxides).

Exemplary polythiols include 2,3-dimercapto-1-propanol, 2-mercaptoethyl ether, 2-mercaptoethyl sulfide, 1,6-hexanedithiol, 1,8-octanedithiol, 1,8-dimercapto-3,6-dithiaoctane, propane-1,2,3-trithiol, and trithiocyanuric acid.

Another exemplary class of polythiols include those obtained by esterification of a polyol with a terminally thiol-substituted carboxylic acid (or derivative thereof (e.g., esters or acyl halides)) including α- or β-mercaptocarboxylic acids (e.g., thioglycolic acid, β-mercaptopropionic acid, 2-mercaptobutyric acid, or esters thereof).

Exemplary commercially available compounds include ethylene glycol bis(thioglycolate), pentaerythritol tetrakis(3-mercaptopropionate), dipentaerythritol hexakis(3-mercaptopropionate), ethylene glycol bis(3-mercaptopropionate), trimethylolpropane tris(thioglycolate), trimethylolpropane tris(3-mercaptopropionate), pentaerythritol tetrakis(thioglycolate), pentaerythritol tetrakis(3-mercaptopropionate), pentaerithrytol tetrakis (3-mercaptobutylate), 1,4-bis-3-mercaptobutyloxy butane, tris[2-(3-mercaptopropionyloxy)ethyl]isocyanurate, trimethylolpropane tris(mercaptoacetate), 2,4-bis(mercaptomethyl)-1,3,5-triazine-2,4-dithiol, 2-(3-di(2-mercaptoethyl)thio)-1-propanethiol, dimercaptodiethylsufide, and ethoxylated trimethylpropan-tri(3-mercaptopropionate).

A specific example of a polymeric polythiol is polypropylene ether glycol bis(3-mercaptopropionate), which is prepared by esterification of polypropylene-ether glycol (available, for example, under the trade designation "PLURACOL P201" from BASF Wyandotte Chemical Corp., Florham Park, N.J.), and 3-mercaptopropionic acid by esterification.

Useful soluble, high molecular weight thiols include polyethylene glycol di(2-mercaptoacetate), (available, for example, under the trade designation "LP-3" from Morton Thiokol Inc., Trenton, N.J.), and polythiol blends (available, for example, under the trade designation "PERMAPOL P3" from Products Research & Chemical Corp., Glendale, Calif.) and compounds such as the adduct of 2-mercaptoethylamine and caprolactam.

The curable composition contains a polyalkene. Exemplary polyalkenes include terminal polyalkene, poly(vinyl ether), poly(allyl ether), or poly(allyl amine). In some embodiments, polyalkenes include allyl pentaerythritol, bisphenol A diallyl ether, o,o'-diallyl bisphenol A, triallyl isocyanurate, triallyl cyanurate, diallyl phthalate, diallyl isophthalate, diallyl terephthalate, aliphatic allyl oligomer (available for example, from Sartomer, Exton, Pa., under the trade designation "CN9101"), and aliphatic allyl urethane (available for example, from Sartomer, under the trade designation "CN9102"). The polyalkene has at least two reactive alkene groups. Such polyalkenes are of the general formula:

$$R^1{-}[{-}CR^{10}{=}CHR^{11}]_x, \quad \quad \text{II}$$

wherein
$R^1$ is a polyvalent (hetero)hydrocarbyl group,
each of $R^{10}$ and $R^{11}$ are independently H or $C_1$-$C_4$ alkyl; and
x is ≥2.

The compounds of Formula II may include vinyl ethers.

In some embodiments, $R^1$ is an aliphatic or aromatic group. $R^1$ can be selected from alkyl groups of 1 to 20 carbon atoms or aryl aromatic groups containing 6-18 ring atoms. $R^2$ has a valence of x, where x is at least 2 (in some embodiments, greater than 2). $R^2$ optionally contains at least one or more esters, amide, ether, thioether, urethane, or urea functional groups. The compounds of Formula II may include a mixture of compounds having an average functionality of at least two or greater. In some embodiments, $R^{10}$ and $R^{11}$ may be taken together to form a ring.

In some embodiments, $R^1$ is a heterocyclic group. Heterocyclic groups include both aromatic and non-aromatic ring systems that contain at least one nitrogen, oxygen, or sulfur heteroatom. Suitable heteroaryl groups include furyl, thienyl, pyridyl, quinolinyl, tetrazolyl, imidazo, and triazinyl. The heterocyclic groups can be unsubstituted or substituted by at least one substituent of alkyl, alkoxy, alkylthio, hydroxy, halogen, haloalkyl, polyhaloalkyl, perhaloalkyl (e.g., trifluoromethyl), trifluoroalkoxy (e.g., trifluoromethoxy), nitro, amino, alkylamino, dialkylamino, alkylcarbonyl, alkenylcarbonyl, arylcarbonyl, heteroarylcarbonyl, aryl, arylalkyl, heteroaryl, heteroarylalkyl, heterocyclyl, heterocycloalkyl, nitrile, or alkoxycarbonyl.

In some embodiments, the alkene compound is the reaction product of a mono- or polyisocyanate:

$R^3(NCO)x + HX^1-R^5(CR^{10}=CHR^{11})y \longrightarrow R^3[NH-C(O)-X^1-R^5(CR^{10}=CHR^{11})y]x$ wherein $R^3$ is a (hetero)hydrocarbyl group;

$X^1$ is —O—, —S— or —$NR^4$—, where $R^4$ is H of $C_1$-$C_4$ alkyl;

each of $R^{10}$ and $R^{11}$ are independently H or $C_1$-$C_4$ alkyl;

$R^5$ is a (hetero)hydrocarbyl group; and x and y are at least 1, and at least one of them is at least 2.

In some embodiments, $R^5$ may be alkylene, arylene, alkarylene, aralkylene, with optional in-chain heteratoms. $R^5$ can be selected from alkyl groups of 1 to 20 carbon atoms or aryl aromatic groups containing 6-18 ring atoms. $R^2$ has a valence of x, where x is at least 2 (in some embodiments, greater than 2). $R^1$ optionally contains at least one, amide, ether, thioether, urethane, or urea functional group.

Polyisocyanate compounds useful in preparing the alkene compounds comprise isocyanate groups attached to the multivalent organic group that can comprise, in some embodiments, a multivalent aliphatic, alicyclic, or aromatic moiety ($R^3$); a multivalent aliphatic, an alicyclic or aromatic moiety attached to a biuret, an isocyanurate, or a uretdione, or mixtures thereof. In some embodiments, polyfunctional isocyanate compounds contain at least two isocyanate (—NCO) radicals. Compounds containing at least two —NCO radicals include, for example, those comprised of di- or trivalent aliphatic, alicyclic, aralkyl, or aromatic groups, to which the —NCO radicals are attached.

Representative examples of suitable polyisocyanate compounds include isocyanate functional derivatives of the polyisocyanate compounds as defined herein. Examples of derivatives include those selected from the group consisting of ureas, biurets, allophanates, dimers and trimers (e.g., uretdiones and isocyanurates) of isocyanate compounds, and mixtures thereof. Any suitable organic polyisocyanate (e.g., an aliphatic, alicyclic, aralkyl, or aromatic polyisocyanate) may be used either singularly or in mixtures of at least two.

The aliphatic polyisocyanate compounds generally provide better light stability than the aromatic compounds. Aromatic polyisocyanate compounds, on the other hand, are generally more economical and reactive toward nucleophiles than are aliphatic polyisocyanate compounds. Suitable aromatic polyisocyanate compounds include those selected from the group consisting of 2,4-toluene diisocyanate (TDI), 2,6-toluene diisocyanate, an adduct of TDI with trimethylolpropane (available, for example, under the trade designation "DESMODUR CB" from Bayer Corporation, Pittsburgh, Pa.), the isocyanurate trimer of 2,2,4-trimethyl-hexamethylene diisocyanate (TDI) (available, for example, under the trade designation "DESMODUR IL" from Bayer Corporation), diphenylmethane 4,4'-diisocyanate (MDI), diphenylmethane 2,4'-diisocyanate, -diisocyanato-naphthalene, 1,4-phenylene diisocyanate, 1,3-phenylene diisocyanate, 1-methyoxy-2,4-phenylene diisocyanate, 1-chlorophenyl-2,4-diisocyanate, and mixtures thereof.

Exemplary alicyclic polyisocyanate compounds include those selected from the group consisting of dicyclohexylmethane diisocyanate ($H_{12}$ MDI, available, for example, under the trade designation "DESMODUR" from Bayer Corporation), 4,4'-isopropyl-bis(cyclohexylisocyanate), isophorone diisocyanate (IPDI), cyclobutane-1,3-diisocyanate, cyclohexane 1,3-diisocyanate, cyclohexane 1,4-diisocyanate (CHDI), 1,4-cyclohexanebis(methylene isocyanate) (BDI), dimer acid diisocyanate (available from Bayer), 1,3-bis(isocyanatomethyl)cyclohexane ($H_6$ XDI), 3-isocyanatomethyl-3,5,5-trimethylcyclohexyl isocyanate, and mixtures thereof.

Exemplary aliphatic polyisocyanate compounds include tetramethylene 1,4-diisocyanate, hexamethylene 1,4-diisocyanate, hexamethylene 1,6-diisocyanate (HDI), octamethylene 1,8-diisocyanate, 1,12-diisocyanatododecane, 2,2,4-trimethyl-hexamethylene diisocyanate (TMDI), 2-methyl-1,5-pentamethylene diisocyanate, dimer diisocyanate, the urea of hexamethylene diisocyanate, the biuret of hexamethylene 1,6-diisocyanate (HDI) (available, for example, under the trade designations "DESMODUR N-100" and "DESMODUR N-3200" from Bayer Corporation, Pittsburgh, Pa.), the isocyanurate of HDI (available, for example, under the trade designations "DESMODUR N3300" and "DESMODUR N-3600" from Bayer Corporation), a blend of the isocyanurate of HDI and the uretdione of HDI (available, for example, under the trade designation "DESMODUR N3300" from Bayer Corporation), and mixtures thereof.

Exemplary aralkyl polyisocyanates (having alkyl substituted aryl groups) include m-tetramethyl xylylene diisocyanate (m-TMXDI), p-tetramethyl xylylene diisocyanate (p-TMXDI), 1,4-xylylene diisocyanate (XDI), 1,3-xylylene diisocyanate, p-(1-isocyanatoethyl)phenyl isocyanate, m-(3-isocyanatobutyl)phenyl isocyanate, 4-(2-isocyanatocyclohexyl-methyl)phenyl isocyanate, and mixtures thereof.

Exemplary polyisocyanates include 2,2,4-trimethyl-hexamethylene diisocyanate (TMDI), tetramethylene 1,4-diisocyanate, hexamethylene 1,4-diisocyanate, hexamethylene 1,6-diisocyanate (HDI), octamethylene 1,8-diisocyanate, 1,12-diisocyanatododecane, mixtures thereof, and a biuret, an isocyanurate, or a uretdione derivative.

In some embodiments, the polyalkene compound is a cyanurate or isocyanurate of the formulas:

wherein n is at least one;

each of $R^{10}$ and $R^{11}$ are independently H or $C_1$-$C_4$ alkyl.

The polyalkene compounds may be prepared, for example, as the reaction product of a polythiol compound and an epoxy-alkene compound via thiol-epoxy ring opening reaction as shown below.

Similarly, the polyalkene compound may be prepared, for example, by reaction of a polythiol with a di- or higher epoxy compound, followed by reaction with an epoxy-alkene compound.

Alternatively, for example, a polyamino compound may be reacted with an epoxy-alkene compound, or a polyamino compound may be reacted with a di- or higher epoxy compound, followed by reaction with an epoxy-alkene compound.

The polyalkene may be prepared, for example, by reaction of a bis-alkenyl amine, such a $HN(CH_2CH=CH_2)_2$, with either a di- or higher epoxy compound, or with a bis- or high (meth)acrylate, or a polyisocyanate.

The polyalkene may be prepared, for example, by reaction of a hydroxy-functional polyalkenyl compound, such as $(CH_2=CH-CH_2-O)_y-R-OH$ with a polyepoxy compound or a polyisocyanate.

An oligomeric polyalkene may be prepared, for example, by reaction between a hydroxyalkyl (meth)acrylate and an allyl glycidyl ether.

In some embodiments, the polyalkene and/or the polythiol compounds are oligomeric and prepared, for example, by reaction of the two with one in excess. For example, polythiols of Formula I may be reacted with an excess of polyalkenes of Formula I, such that an oligomeric polyalkene results having a functionality of at least two as shown below. Conversely an excess of polythiols of Formula I may be reacted, for example, with the polyalkenes of Formula II, such that an oligomeric polythiol results having a functionality of at least two. The oligomeric polyalkenes and polythiols may be represented by the following formulas, where subscript z is two or greater. $R^1$, $R^2$, $R^{10}$, $R^{11}$, y and x are as previously defined.

In the formulas above, a linear thiol-alkene polymer is shown for simplicity. It will be understood that the pendent ene groups of the first polymer will have reacted with the excess thiol, and the pendent thiol groups of the second polymer will have reacted with the excess alkene.

Representative thiolether polyalkene oligomers with one terminal ene group reacted are demonstrated below.

In some embodiments, additional (meth)acrylates in limited amounts may be combined with polyalkene in the thiol-alkene polymer matrix binder composition. In some embodiments, a radiation curable (meth)acrylate compound can adjust the viscosity of the composition used to form the polymer matrix and can reduce defects that would otherwise be created during the thermal acceleration of the thiol-alkene resin. Exemplary radiation curable (meth)acrylate compounds have barrier properties to minimize the ingress of water and/or oxygen. In some embodiments, (meth)acrylate compounds with a glass transition temperature ($T_g$) of greater than about 50° C. (in some embodiments, greater than about 80° C., and of even greater than 100° C.), based on the homopolymer of (meth)acrylates, and substituents capable of forming high crosslink densities can provide a polymer matrix with improved gas and water vapor barrier properties. In some embodiments, the radiation curable (meth)acrylate compound is multifunctional (available, for example, under the trade designations "SR 348" (ethoxylated (2) bisphenol A di(meth)acrylate), "SR 349" (ethoxylated (2) bisphenol A diacrylate), "SR540" (ethoxylated (4) bisphenol A di(meth)acrylate), and "SR239" (1,6-hexane diol di(meth)acrylate) from Sartomer USA, LLC, Exton, Pa.).

Typically, the (meth)acrylate compound forms about 0 wt. % to about 25 wt. %, (in some embodiments, about 5 wt. % to about 25 wt. %, or about 10 wt. % to about 20 wt. %) of the polymer matrix composition. In some embodiments, if the (meth)acrylate polymer forms less than 5 wt. % of the organic polymer matrix composition, the (meth)acrylate compound does not adequately increase the viscosity of the resin composition used to form the organic polymer matrix to provide the thiol-alkene composition with a sufficient working time.

The components are generally used in approximately 1:1 molar amounts of thiol groups to alkene groups, +/−20%. Therefore, the molar ratio of thiol groups of the polythiol to alkene groups of the polyalkene will be from 1.2:1 to 1:1.2 (in some embodiments, 1.1:1 to 1:1.1). In embodiments where the thiol-alkene polymer composition further comprises an (meth)acrylate component, the molar functional group equivalent of alkene plus the molar functional group equivalent of (meth)acrylate is equal to the thiol equivalents +/−20%.

The thiol-alkene resin may be prepared, for example, by combining the polythiol and polyalkene in suitable ratios and then free-radically cured using a photo, thermal or redox initiator.

The thiol-alkene resin may be cured, for example, by exposure to actinic radiation (e.g., ultraviolet (UV) light). The composition may be exposed to any form of actinic radiation, (e.g., visible light or UV radiation), but is preferably exposed to UVA radiation (320 to 390 nm) or UVB radiation (395 to 445 nm). Generally, the amount of actinic radiation should be sufficient to form a solid mass that is not sticky to the touch. Generally, the amount of energy required for curing the compositions of the described herein range from about 0.2 J/cm² to 20.0 J/cm².

To initiate photopolymerization, the resin is placed under a source of actinic radiation such as a high-energy ultraviolet source having a duration and intensity of such exposure to provide for essentially complete (greater than 80%) polymerization of the composition contained in the molds. If desired, filters may be employed to exclude wavelengths that may deleteriously affect the reactive components or the photopolymerization. Photopolymerization may be affected via an exposed surface of the curable composition, or through the barrier layers as described herein by appropriate selection of a barrier film having the requisite transmission at the wavelengths necessary to effect polymerization.

Photoinitiation energy sources emit actinic radiation (i.e., radiation having a wavelength of 700 nanometers or less), which is capable of producing, either directly or indirectly, free radicals capable of initiating polymerization of the thiol-alkene compositions. In some embodiments, photoinitiation energy sources emit ultraviolet radiation (i.e., radiation having a wavelength between about 180 and about 460 nanometers) including photoinitiation energy sources such as mercury arc lights, carbon arc lights, low, medium, or high pressure mercury vapor lamps, swirl-flow plasma arc lamps, xenon flash lamps, ultraviolet light emitting diodes, and ultraviolet light emitting lasers. Ultraviolet light emitting diodes are available, for example, from Nichia Corp., Tokyo, Japan under the trade designations "NVSU233A U385," "NVSU233A U404," "NCSU276A U405," and "NCSU276A U385."

In one exemplary embodiment, the initiator is a photoinitiator and is capable of being activated by UV radiation. Exemplary photoinitiators include benzoin ethers (e.g., benzoin methyl ether and benzoin isopropyl ether, and substituted benzoin ethers), and substituted acetophenones (e.g., 2,2-dimethoxy-2-phenylacetophenone, and substituted alpha-ketols). Commercially available photoinitiators include those under the trade designations "IGACURE 819" and "DAROCUR 1173" from Ciba-Geigy Corp., Hawthorne, N.Y.; "LUCEM TPO" from BASF, Parsippany, N.J.; "IGACURE 651" (2,2-dimethoxy-1,2-diphenyl-1-ethanone) from Ciba-Geigy Corp. Exemplary photoinitiators include ethyl 2,4,6-trimethylbenzoylphenyl phosphinate (available, for example, under the trade designation "LUCIRIN TPO-L" from BASF, Florham Park, N.J.), 2-hydroxy-2-methyl-1-phenyl-propan-1-one (available, for example, under the trade designation "IRGACURE 1173" from Ciba Specialties, division of BASF, Florham, N.J.), 2,2-dimethoxy-2-phenyl acetophenone (available, for example, under the trade designation "IRGACURE 651" from Ciba Specialties), phenyl bis(2,4,6-trimethyl benzoyl)phosphine oxide (available, for example, under the trade designation "IRGACURE 819" from Ciba Specialties). Other exemplary photoinitiators include mercaptobenzothiazoles, mercaptobenzooxazoles and hexaryl bisimidazole.

Exemplary thermal initiators include peroxides (e.g., benzoyl peroxide, dibenzoyl peroxide, dilauryl peroxide, cyclohexane peroxide, methyl ethyl ketone peroxide), hydroperoxides (e.g., tert-butyl hydroperoxide and cumene hydroperoxide), dicyclohexyl peroxydicarbonate, 2,2-azobis(isobutyronitrile), and t-butyl perbenzoate. Commercially available thermal initiators include those available under the trade designation "VAZO" (e.g., "VAZO 64" (2,2'-azo-bis (isobutyronitrile) and "VAZO 52" 2,2'-Azobis(2,4-dimethylvaleronitrile) from DuPont Specialty Chemical, Wilmington, Del.) and "LUCIDO 70" from Elf Atochem North America, Philadelphia, Pa.

The thiol-alkene resins may also be polymerized using a redox initiator system of an organic peroxide and a tertiary amine, as described in, for example, Bowman et al., Redox Initiation of Bulk Thiol-alkene Polymerizations, Polym. Chem., 2013, 4, 1167-1175, and references therein.

Generally, the amount of initiator is less than 5 wt. % (in some embodiments, less than 2 wt. %). In some embodiments, there is no added free radical initiator.

If desired, a stabilizer or inhibitor may be added to the thiol-alkene composition to control the rate of reaction. The stabilizer can be any known in the art of thiol-alkene resins and include the N-nitroso compounds described in U.S. Pat. No. 5,358,976 (Dowling et al.) and U.S. Pat. No. 5,208,281 (Glaser et al.), and the alkenyl substituted phenolic compounds described in U.S. Pat. No. 5,459,173 (Glaser et al.), the disclosures of which are incorporated herein by reference.

In some embodiments, the binder composition can be cured or hardened by heating. In other embodiments, the quantum dot composition may also be cured or hardened by applying radiation such as, for example, UV light. Curing or hardening steps may include UV curing, heating, or both. In some example embodiments that are not intended to be limiting, UV cure conditions can include applying about 10 mJ/cm$^2$ to about 4000 mJ/cm$^2$ of UVA (in some embodiments, about 10 mJ/cm$^2$ to about 200 mJ/cm$^2$ of UVA). Heating and UV light may also be applied alone or in combination to increase the viscosity of the binder composition, which can allow easier handling on coating and processing lines.

In some embodiments, the thiol-alkene formulatin has a viscosity in a range from 300 cP to 20,000 cP (in some embodiments, 500 cP to 15,000 cP, or even 1,000 cP to 5,000 cP) when the article is film.

The cured thiol-alkene polymer matrix has a transmissivity of at least 90% (in some embodiments, at least 95%) in the spectral region of incident radiation, typically region of 450±50 nm.

The cured thiol-alkene polymer matrix has $T_g$ at least 20° C.; preferably at least 30° C.

Articles can be made comprising encapsulated composite particles and a thiol-alkene polymer matrix. Exemplary articles described herein can be made for use in display applications such as films (e.g., remote phosphor diffuser films for handheld devices, tablets, monitors, or televisions), LED caps, LED coatings, LED lenses, and light guides. In some embodiments, films comprising composite particles described herein are made. In some embodiments, a film further comprises a high barrier substrate film. Films can be made, for example, by coating a material onto a substrate and curing (polymerizing or crosslinking) the material.

Exemplary articles described herein can be made for use in nondisplay applications such as security applications where quantum dot phosphors are used to provide fluorescence at selected or tailored wavelengths. In such uses, the organic polymer matrix could be a label or a coating on a label, or other articles such as a card or tag.

EXEMPLARY EMBODIMENTS

1A. An article comprising particles in an organic polymer matrix comprising a cured thiol-alkene resin having a $T_g$ greater than 20° C. (in some embodiments, greater than 25° C., or even greater than 30° C.; in a range from 20° C. to 120° C.), wherein the particles comprise a composite core and a continuous nonmetallic inorganic coating (e.g., non-optically absorbing) covering the composite core, wherein the composite core comprises a nonmetallic inorganic matrix, ligands, and quantum dots, wherein the nonmetallic inorganic matrix is present in the composite core in an amount of up to 40 (in some embodiments, up to 35, 30, 25, or even up to 20; in some embodiments, in a range from 5 to 40, 5 to 30, or even 5 to 20) volume percent, and wherein the coating has an average thickness up to 5 micrometers (in some embodiments, up to 4 micrometers, 3 micrometers, 2 micrometers, 1 micrometer, 750 nm, 500 nm, 250 nm, 100 nm, or even up to 50 nm; in some embodiments, in a range from 5 nm to 500 nm, 10 nm to 500 nm, or even 25 nm to 500 nm).

2A. The article of Exemplary Embodiment 1A, wherein the nonmetallic inorganic matrix comprises at least one of silica or metal oxide (e.g., at least one oxide of Al, Si, Ti, Zr, Mg, or Zn).

3A. The article of any preceding A Exemplary Embodiment, wherein collectively the ligands and the quantum dots are present in the composite core in an amount of at least 60 (in some embodiments, at least 65, 70, 75, 80, 85, or even at least 90; in some embodiments, in a range from 60 to 95, or even 70 to 95) volume percent.

4A. The article of any preceding A Exemplary Embodiment, wherein the nonmetallic inorganic matrix is aerogel.

5A. The article of any preceding A Exemplary Embodiment, wherein the nonmetallic inorganic matrix is chromatography media.

6A. The article of any preceding A Exemplary Embodiment, wherein the composite core further comprises a liquid.

7A. The article of Exemplary Embodiment 6A, wherein the liquid is a nonvolatile liquid (i.e., has a vapor pressure at 25° C. of up to 1 torr).

8A. The article of Exemplary Embodiment 6A, wherein the liquid is a volatile liquid having a vapor pressure at 25° C. of greater than 1 torr (in some embodiments, at least 5, or even at least 10 torr).

9A. The article of Exemplary Embodiments 6A to 8A, wherein collectively the liquid, the ligands, and the quantum dots are present in the composite core in an amount greater than 50 (in some embodiments, at least 55, 60, 70, or even at least 75; in some embodiments, in a range from 50 to 75, or even 60 to 95) volume percent.

10A. The article of Exemplary Embodiments 6A to 9A, wherein the quantum dots, the ligands, and the liquid are in the form of a liquid-ligand system.

11A. The article of any preceding A Exemplary Embodiment, wherein the ligands include at least one of an aminosilicone or a carboxylic acid functional polymer.

12A. The article of any preceding A Exemplary Embodiment, wherein the quantum dots comprise at least one of ZnS, ZnSe, CdS, CdSe, PbS, InP, InAs, GaAs, GaP, Si, or Ge.

13A. The article of any preceding A Exemplary Embodiment, wherein the quantum dots comprise CdSe or InP nanoparticles.

14A. The article of any preceding A Exemplary Embodiment, wherein the composite core further comprises an organic polymer.

15A. The article of Exemplary Embodiment 14A, wherein the organic polymer is at least one of an acrylate or an epoxy.

16A. The article of either Exemplary Embodiment 14A or 15A, wherein collectively the liquid, the ligands, the organic polymer, and the quantum dots are present in the composite core in an amount greater than 50 (in some embodiments, at least 55, 60, 70, or even at least 75; in some embodiments, in a range from 50 to 75, or even 60 to 95) volume percent.

17A. The article of any preceding A Exemplary Embodiment, wherein the coating at least partially penetrates into the composite core.

18A. The article of any preceding A Exemplary Embodiment, wherein the composite core comprises a mesoporous structure.

19A. The article of any preceding A Exemplary Embodiment, wherein the nonmetallic inorganic matrix has an average pore size, if components of the composite core other than the nonmetallic inorganic matrix were not present, is not greater than 250 nm (in some embodiments, not greater than 200 nm, 150 nm, 100 nm, 75 nm, 50 nm, 25 nm, or even not greater than 10 nm; in some embodiments, in a range from 5 nm to 250 nm, 5 nm to 200 nm, 5 nm to 150 nm, 5 nm to 100 nm, 5 nm to 75 nm, 5 nm to 50 nm, 5 nm to 25 nm, or even 10 nm to 100 nm).

20A. The article of any preceding A Exemplary Embodiment, wherein the coating comprises at least one form selected from the group consisting of amorphous, crystalline, hydroxide, hydrous oxide, anhydrous oxide, and combinations thereof.

21A. The article of any preceding A Exemplary Embodiment, wherein the coating comprises at least one oxide comprising at least one of Al, Si, Ti, Zr, or Mg.

22A. The article of any preceding A Exemplary Embodiment, wherein the nonmetallic inorganic matrix has a hydrophobic surface.

23A. The article of any preceding A Exemplary Embodiment, wherein the nonmetallic inorganic matrix has a hydrophilic surface.

24A. The article of any preceding A Exemplary Embodiment, wherein the nonmetallic inorganic matrix has an untreated metal oxide surface.

25A. The article of any preceding A Exemplary Embodiment, wherein the particle has air stable light emission properties.

26A. The article of any preceding A Exemplary Embodiment, wherein the particle has air stable photoluminescent efficiency.

27A. The articles of any preceding A Exemplary Embodiment, wherein the particles are in a range from 10 micrometers to 100 micrometers (in some embodiments, in a range from 20 micrometers to 50 micrometers).

28A. The article of any preceding A Exemplary Embodiment, wherein the thiol-alkene is derived from at least one polythiol and at least one polyalkene, and wherein the cured reaction product of at least one polythiol and at least one polyalkene compound, and wherein the functionality of both the polythiol and the polyalkenyl is at least 2.

29A. The article of Exemplary Embodiment 28A, wherein the polyalkene is at least one of terminal polyalkene, poly(vinyl ether), poly(allyl ether), or poly(allyl amine).

30A. The article of Exemplary Embodiment 28A or 29A, wherein the polyalkene is at least one of allyl pentaerythritol, bisphenol A diallyl ether, o,o'-diallyl bisphenol A, triallyl isocyanurate, triallyl cyanurate, diallyl phthalate, diallyl isophthalate, diallyl terephthalate, aliphatic allyl oligomer, or aliphatic allyl urethane.

31A. The article of any of Exemplary Embodiments 28A to 30A, wherein the polythiol is at least one of pentaerythritol tetrakis(3-mercaptopropionate), pentaerythritol tetramercaptoacetate, tris(2-(3-mercaptopropionyloxy)ethyl)isocyanurate, 1,6-hexanedithiol, 1,8-octanedithiol, dipentaerythritol hexakis(3-mercaptopropionate), trimethylolpropane tris(3-mercaptopropionate), trimethylolpropane tris(mercaptoacetate), pentaerithrytol tetrakis(3-mercaptobutylate), or dipentaerythritol hexakis(3-mercaptopropionate).

32A. The article of Exemplary Embodiment 28A, wherein the polyalkene is of the formula:

wherein
$R^1$ is a polyvalent (hetero)hydrocarbyl group,
each of $R^{10}$ and $R^{11}$ are independently H or $C_1$-$C_4$ alkyl;
and x is ≥2.

33A. The article of Exemplary Embodiment 31A, wherein $R^1$ is a cyclic aliphatic group, wherein said cyclic aliphatic group contains at least one of an ester, an amide, an ether, a thioether, a urethane, or a urea functional group, and x is ≥2.

34A. The article of Exemplary Embodiment 31A, wherein $R^1$ is an aliphatic or aromatic group, wherein said cyclic aliphatic group or said aromatic group contains at least one of an ester, an amide, an ether, a thioether, a urethane, or a urea functional group, and x is ≥2.

35A. The article of Exemplary Embodiment 28A, wherein the polythiol is of the formula: $R^2(SH)_y$, where $R^2$ is (hetero)hydrocarbyl group having a valence of y, and y is ≥2.

36A. The article of Exemplary Embodiment 35A, where $R^2$ is an aliphatic or aromatic group, and wherein said aliphatic or aromatic group contains at least one of an ester, an amide, an ether, a urethane, a thioether, or a urea functional group, and x is ≥2.

37A. The article of Exemplary Embodiment 35A, where $R^2$ is an aliphatic, cycloaliphatic, aromatic or alkyl-substituted aromatic moiety having from 1 to 30 carbon atoms and optionally 1 to 4 catenary heteroatoms of oxygen, nitrogen or sulfur.

38A. The article of Exemplary Embodiment 28A, wherein said polythiol is obtained by esterification of a polyol with a terminally thiol-substituted carboxylic acid.

39A. The article of any preceding A Exemplary Embodiment, wherein the thiol-alkene has no (meth)acrylate or alkynyl groups.

40A. The article of any preceding A Exemplary Embodiment, wherein the organic polymer matrix comprising the cured thiol-alkene resin has a transmissivity of at least 90% in the region of 450±50 nm.

41A. The article of any preceding A Exemplary Embodiment, wherein the stoichiometric ratio of thiol groups to alkene groups is 1.2:1 to 1:1.2.

1B. A curable composition comprising at least one polythiol, at least one polyalkene, and particles, wherein the particles comprise a composite core and a continuous nonmetallic inorganic coating (e.g., nonoptically absorbing material that absorbs less than 20% of the light energy (i.e., wavelength in the range from 460 nm to 720 nm) emitted by the quantum dots) covering the composite core, wherein the composite core comprises a nonmetallic inorganic matrix, ligands, and quantum dots, wherein the nonmetallic inorganic matrix is present in the composite core in an amount of up to 40 (in some embodiments, up to 35, 30, 25, or even up to 20; in some embodiments, in a range from 5 to 40, 5 to 30, or even 5 to 20) volume percent, and wherein the coating has an average thickness up to 5 micrometers (in some embodiments, up to 4 micrometers, 3 micrometers, 2 micrometers, 1 micrometer, 750 nm, 500 nm, 250 nm, 100 nm, or even up to 50 nm; in some embodiments, in a range from 5 nm to 500 nm, 10 nm to 500 nm, or even 25 nm to 500 nm.

2B. The curable composition of Exemplary Embodiment 1B, wherein the nonmetallic inorganic matrix comprises at least one of silica or metal oxide (e.g., at least one oxide of Al, Si, Ti, Zr, Mg, or Zn).

3B. The curable composition of any preceding B Exemplary Embodiment, wherein collectively the ligands and the quantum dots are present in the composite core in an amount of at least 60 (in some embodiments, at least 65, 70, 75, 80, 85, or even at least 90; in some embodiments, in a range from 60 to 95, or even 70 to 95) volume percent.

4B. The curable composition of any preceding B Exemplary Embodiment, wherein the nonmetallic inorganic matrix is aerogel.

5B. The curable composition of any preceding B Exemplary Embodiment, wherein the nonmetallic inorganic matrix is chromatography media.

6B. The curable composition of any preceding B Exemplary Embodiment, wherein the composite core further comprises a liquid.

7B. The curable composition of Exemplary Embodiment 6B, wherein the liquid is a nonvolatile liquid (i.e., has a vapor pressure at 25° C. of up to 1 torr).

8B. The curable composition of Exemplary Embodiment 6B, wherein the liquid is a volatile liquid having a vapor pressure at 25° C. of greater than 1 torr (in some embodiments, at least 5, or even at least 10 torr).

9B. The curable composition of Exemplary Embodiments 6B to 8B, wherein collectively the liquid, the ligands, and the quantum dots are present in the composite core in an amount greater than 50 (in some embodiments, at least 55, 60, 70, or even at least 75; in some embodiments, in a range from 50 to 75, or even 60 to 95) volume percent.

10B. The curable composition of Exemplary Embodiments 6B to 9B, wherein the quantum dots, the ligands, and the liquid are in the form of a liquid-ligand system.

11B. The curable composition of any preceding B Exemplary Embodiment, wherein the ligands include at least one of an aminosilicone or a carboxylic acid functional polymer.

12B. The curable composition of any preceding B Exemplary Embodiment, wherein the quantum dots comprise at least one of ZnS, ZnSe, CdS, CdSe, PbS, InP, InAs, GaAs, GaP, Si, or Ge.

13B. The curable composition of any preceding B Exemplary Embodiment, wherein the quantum dots comprise CdSe or InP nanoparticles.

14B. The curable composition of any preceding B Exemplary Embodiment, wherein the composite core further comprises an organic polymer.

15B. The curable composition of Exemplary Embodiment 14B, wherein the organic polymer is at least one of an acrylate or an epoxy.

16B. The curable composition of either Exemplary Embodiment 14B or 15B, wherein collectively the liquid, the ligands, the organic polymer, and the quantum dots are present in the composite core in an amount greater than 50 (in some embodiments, at least 55, 60, 70, or even at least 75; in some embodiments, in a range from 50 to 75, or even 60 to 95) volume percent.

17B. The curable composition of any preceding B Exemplary Embodiment, wherein the coating at least partially penetrates into the composite core.

18B. The curable composition of any preceding B Exemplary Embodiment, wherein the composite core comprises a mesoporous structure.

19B. The curable composition of any preceding B Exemplary Embodiment, wherein the nonmetallic inorganic matrix has an average pore size, if components of the composite core other than the nonmetallic inorganic matrix were not present, is not greater than 250 nm (in some embodiments, not greater than 200 nm, 150 nm, 100 nm, 75 nm, 50 nm, 25 nm, or even not greater than 10 nm; in some embodiments, in a range from 5 nm to 250 nm, 5 nm to 200 nm, 5 nm to 150 nm, 5 nm to 100 nm, 5 nm to 75 nm, 5 nm to 50 nm, 5 nm to 25 nm, or even 10 nm to 100 nm).

20B. The curable composition of any preceding B Exemplary Embodiment, wherein the coating comprises at least one form selected from the group consisting of amorphous, crystalline, hydroxide, hydrous oxide, anhydrous oxide, and combinations thereof.

21B. The curable composition of any preceding B Exemplary Embodiment, wherein the coating comprises at least one oxide comprising at least one of Al, Si, Ti, Zr, or Mg.

22B. The curable composition of any preceding B Exemplary Embodiment, wherein the nonmetallic inorganic matrix has a hydrophobic surface.

23B. The curable composition of any preceding B Exemplary Embodiment, wherein the nonmetallic inorganic matrix has a hydrophilic surface.

24B. The curable composition of any preceding B Exemplary Embodiment, wherein the nonmetallic inorganic matrix has an untreated metal oxide surface.

25B. The curable composition of any preceding B Exemplary Embodiment, wherein the particle has air stable light emission properties.

26B. The curable composition of any preceding B Exemplary Embodiment, wherein the particle has air stable photoluminescent efficiency.

27B. The curable composition of any preceding B Exemplary Embodiment, wherein the particles are in a range from 10 micrometers to 100 micrometers (in some embodiments, in a range from 20 micrometers to 50 micrometers).

28B. The curable composition of any preceding B Exemplary Embodiment, wherein the thiol-alkene is derived from at least one polythiol and at least one polyalkene, and wherein the cured reaction product of at least one polythiol and at least one polyalkene compound, and wherein the functionality of both the polythiol and the polyalkenyl is at least 2.

29B. The curable composition of Exemplary Embodiment 28B, wherein the polyalkene is at least one of terminal polyalkene, poly(vinyl ether), poly(allyl ether), or poly(allyl amine).

30B. The curable composition of Exemplary Embodiment 28B or 29B, wherein the polyalkene is at least one of allyl pentaerythritol, bisphenol A diallyl ether, o,o'-diallyl bisphenol A, triallyl isocyanurate, triallyl cyanurate, diallyl phthalate, diallyl isophthalate, diallyl terephthalate, aliphatic allyl oligomer, or aliphatic allyl urethane.

31B. The curable composition of any of Exemplary Embodiments 28B to 30B, wherein the polythiol is at least one of pentaerythritol tetrakis(3-mercaptopropionate), pentaerythritol tetramercaptoacetate, tris(2-(3-mercaptopropionyloxy) ethyl)isocyanurate, 1,6-hexanedithiol, 1,8-octanedithiol, dipentaerythritol hexakis(3-mercaptopropionate), trimethylolpropane tris(3-mercaptopropionate), trimethylolpropane tris(mercaptoacetate), pentaerithrytol tetrakis (3-mercaptobutylate), or dipentaerythritol hexakis(3-mercaptopropionate).

32B. The curable composition of Exemplary Embodiment 28B, wherein the polyalkene is of the formula:

$$R^1 + CR^{10} = CHR^{11}]_x,$$

wherein
$R^1$ is a polyvalent (hetero)hydrocarbyl group,
each of $R^{10}$ and $R^{11}$ are independently H or $C_1$-$C_4$ alkyl;
and x is ≥2.

33B. The curable composition of Exemplary Embodiment 31B, wherein $R^1$ is a cyclic aliphatic group, wherein said cyclic aliphatic group contains at least one of an ester, an amide, an ether, a thioether, a urethane, or a urea functional group, and x is ≥2.

34B. The curable composition Exemplary Embodiment 31B, wherein $R^1$ is an aliphatic or aromatic group, wherein said cyclic aliphatic group or said aromatic group contains at least one of an ester, an amide, an ether, a thioether, a urethane, or a urea functional group, and x is ≥2.

35B. The curable composition of Exemplary Embodiment 28B, wherein the polythiol is of the formula: $R^2(SH)_y$, where $R^2$ is (hetero)hydrocarbyl group having a valence of y, and y is ≥2.

36B. The curable composition of Exemplary Embodiment 35B, where $R^2$ is an aliphatic or aromatic group, and wherein said aliphatic or aromatic group contains at least one of an ester, an amide, an ether, a urethane, a thioether, or a urea functional group, and x is ≥2.

37B. The curable composition of Exemplary Embodiment 35B, where $R^2$ is an aliphatic, cycloaliphatic, aromatic or alkyl-substituted aromatic moiety having from 1 to 30 carbon atoms and optionally 1 to 4 catenary heteroatoms of oxygen, nitrogen or sulfur.

38B. The curable composition of Exemplary Embodiment 28B, wherein said polythiol is obtained by esterification of a polyol with a terminally thiol-substituted carboxylic acid.

39B. The curable composition of any preceding B Exemplary Embodiment, wherein the thiol-alkene has no (meth)acrylate or alkynyl groups.

40B. The curable composition of any preceding B Exemplary Embodiment, wherein the stoichiometric ratio of thiol groups to alkene groups is 1.2:1 to 1:1.2.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated. All the preparations unless mentioned were carried out in a Standard Glove Box under nitrogen atmosphere.

EXAMPLES

Materials used in the procedures and examples below are summarized in Table 1, below.

TABLE 1

| Material Name | Abbreviation | Molecular Formula | Source | Source Information |
| --- | --- | --- | --- | --- |
| CdSe quantum dot concentrate | QC | ~15 wt. % CdSe cored green q-dots | Nanosys, Milpitas, CA | aminosilicone oil based liquid ligands, Lot #QCG052214-24, Part # QCEF52035R2-01 |
| Chromatography media | DAV CM | $SiO_2$ | Grace Davison Discovery Science, Deerfield, IL | obtained under the trade designation "DAVISIL XWP1000;" 16 to 24 micrometer particle size |
| Trimethyl Aluminum | TMA | $Al(CH_3)_3$ | STREM Chemicals, Newburyport, MA | Bubbler cylinder |

TABLE 1-continued

| Material Name | Abbreviation | Molecular Formula | Source | Source Information |
|---|---|---|---|---|
| Epoxy resin | EPON 824 | N/A | Hexion, Batesville, AR | obtained under the trade designation "EPON 824;" a modified bisphenol A based resin |
| Monomer | SR348 | $C_{27}H_{34}O_6$ | Sartomer, Exton, PA | obtained under the trade designation "SR348;" ethoxylated (2) bisphenol a dimethacrylate |
| Photoinitiator | D-4265 | $C_{22}H_{21}O_2P$ $C_{10}H_{12}O_2$ | BASF, Florham Park, NJ | obtained under the trade designation "IRGACURE 4265," a liquid photoinitiator blend of acyl phosphine oxide/alpha hydroxy ketone |
| 4,7,9-trioxatridecane-1,13-diamine | TTD-diamine | $C_{10}H_{24}N_2O_3$ | BASF | — |
| Tris[2-(3-mercaptopropionyloxy) ethyl] isocyanurate | TEMPIC | $C_{18}H_{27}N_3O_9S_3$ | Bruno Bock Chemische Fabrik, Marschacht, Germany | — |
| Triallyl isocyanurate | TAIC | $C_{12}H_{15}N_3O_3$ | TCI, Portland, OR | — |
| Ethyl-2,4,6-trimethylbenzoyl phenylphosphinate | TPO-L | $C_{18}H_{21}O_3P$ | BASF | obtained under the trade designation "LUCIRIN TPO-L;" a liquid UV initiator |

Preparation of Infiltrated Composite Core Particles 13.5 grams of chromatographic silica (obtained under the trade designation "DAVISIL XWP1000A" from Grace Davison Discovery Science, Deerfield, Ill.; 16-24 micrometer particle size, 1000 angstrom pore size) was placed in a glass vial. To this chromatographic silica was added a premixed solution of 12.5 grams of green quantum dot concentrate (QC) and 2 grams of ethanol (dry absolute). After mixing well, the resulting material was removed from the glove box and dried under vacuum at about 22° C. to remove the ethanol. The dried composite powder was sieved using a −45 micrometer sieve.

Atmospheric Pressure Chemical Vapor Deposition (APCVD) Encapsulation

Three grams of the infiltrated composite core particles were microencapsulated with an amorphous aluminum oxide based material using a reaction of trimethyl aluminum (TMA; obtained under the trade designation "TRIMETHYL ALUMINUM IN BUBBLER," Lot Number 23403300 from Strem Chemicals, Newburyport, Mass.) and water vapor in a fluidized bed reactor. The reactor was a glass frit funnel tube 2 cm diameter by 18 cm tall. The reactor had an extended inlet tube from below the frit routed parallel to the body of the reactor, and an extended top area above the frit to allow the desired reactor height and fittings for a precursor injector tube and an exhaust outlet. Temperature was controlled at 180° C. using an oil bath. Nitrogen carrier gas was used with standard bubbler configurations for liquid precursors. The bubblers were at ambient temperature of about 22° C.

Examples 1-5

Several powders of encapsulated composite particles were prepared as described above, using the precursor flow ratios and coating times given in Table 2, below.

TABLE 2

| Example | Powder | Water flow, $cm^3$/min. | TMA flow, $cm^3$/min. | Water:TMA, time | Notes |
|---|---|---|---|---|---|
| 1 | DH106 | 175 | 100 | 1.75:1, 3 hours 2.50:1, 2 hours | Sequence of 2 ratios |
| 2 | DH122 | 185 | 100 | 1.85:1, 5 hours | |
| 3 | DH123 | 200 | 100 | 2.00:1, 5 hours | |
| 4 | DH127 | 185 | 100 | 1.85:1, and water, only 5 hours | Alternating 30/5 min |
| 5 | DH130 | 185 | 100 | 1.85:1, 5 hours | |

Preparation of Resins Comprising Composite Particles

Sieved sol-gel composite particles were embedded in a resin for film making. Two different types of resins were used in the comparative examples and the examples. The first resin (epoxy-amine chemistry) includes three parts: A: epoxy resin ("EPON 824")+15% monomer ("SR348"), B: TTD-Diamine, C: D-4265. 1 gram of composite particles is mixed with 2.5 grams part B, 5.5 grams part A and 0.04 gram part C. The second type resin (thiol-alkene chemistry) also consists of three parts: A: TEMPIC B: TAIC, and C: TPO-L. The three parts were premixed at 67 to 32 to 1 weight ratio respectively. 1 gram of composite particles is mixed with 5.4 grams of the combined resin components. Comparative Example films were made from mixtures of CdSe—ZnS (core-shell) quantum dot liquid concentrate (QC) and resin components noted above. For certain comparative samples (Comparative Examples A-D), resin mixtures described above were mixed with plain QC (quantum dot concentrate) at a loading of 5 weight percent QC.

Film Making Using Knife Coater

Resin-composite particle mixtures were coated at a thickness of about 100 micrometers using a knife coater either between sheets of 50 micrometer thick polyethylene terephthalate (PET) film (Examples with a "P" designation and indicated to have "nonprotective PET film" substrates in Tables 3-5 below), or between similar sheets of PET film having high barrier metal oxide thin film coatings (Examples with a "B" designation and indicated to have "protective barrier films" substrates in Tables 3-5, below). Films made with the epoxy-amine resin were ultraviolet (UV) cured using a 385 nm LED light source (obtained under the trade designation "TECH CF200" from Clearstone Technologies, Inc., Hopkins, Minn.; 100-240V, 6.0-3.5 A, 50-60 Hz) for 30 seconds at 50% power, followed by heat curing in an oven for 10 minutes at 100° C. Films made with thiol-alkene resin were only UV cured using a 385 nm LED light source ("TECH CF200") for 30 seconds at 100% power.

Comparative Examples A-D

Films were made as described above. For Comparative Examples A-D, no particles were used. Instead, quantum dot concentrate ("QC", described in Table 1 (above)) was mixed directly with resin, at a loading of 5 wt. %, as noted in "Preparation of Resins Comprising Composite Particles" above. Film samples were made with each type of resin (epoxy amine and thiolene) and each type of substrate (protective barrier films or plain PET) as indicated in Table 3, below.

TABLE 3

| Comparative Example | Film | Powder | Resin | Substrate |
|---|---|---|---|---|
| A | QD-Gen1-C1-P-TE | QC only | thiol-alkene | nonprotective PET films |
| B | QD-Gen1-C1-B-TE | QC only | thiol-alkene | protective barrier films |
| C | Cd-OSD-G-Ctrl-P | QC only | epoxy amine | nonprotective PET films |
| D | C-SC-NS1 | QC only | epoxy amine | protective barrier films |

Comparative Examples E-N

Comparative Example E-N films were made as described above, using each of the powder examples described in Table 2, above. In each case, a sample was made using barrier film substrates, and a sample was made using plain PET substrates. Films in Comparative Examples E-N were made with epoxy amine resin. These films are summarized in Table 4, below.

TABLE 4

| Comparative Example | Film | Powder | Resin | Substrate |
|---|---|---|---|---|
| E | DH106-EA-B | DH106 | Epoxy amine | Barrier film |
| F | DH106-EA-P | DH106 | Epoxy amine | Plain PET |
| G | DH122-EA-B | DH122 | Epoxy amine | Barrier film |
| H | DH122-EA-P | DH122 | Epoxy amine | Plain PET |
| I | DH123-EA-B | DH123 | Epoxy amine | Barrier film |
| J | DH123-EA-P | DH123 | Epoxy amine | Plain PET |
| K | DH127-EA-B | DH127 | Epoxy amine | Barrier film |
| L | DH127-EA-P | DH127 | Epoxy amine | Plain PET |
| M | DH130-EA-B | DH130 | Epoxy amine | Barrier film |
| N | DH130-EA-P | DH130 | Epoxy amine | Plain PET |

Examples 6-15

Example 6-15 films were made as described above, using each of the powder examples described in Table 2, above. In each case, a sample was made using barrier film substrates, and a sample was made using plain PET substrates. Films in Examples 6-15 were made with thiol-alkene resin. These Example films are summarized in Table 5, below.

TABLE 5

| Example | Film | Powder | Resin | Substrate |
|---|---|---|---|---|
| 6 | DH106-TE-B | DH106 | Thiol-alkene | Barrier film |
| 7 | DH106-TE-P | DH106 | Thiol-alkene | Plain PET |
| 8 | DH122-TE-B | DH122 | Thiol-alkene | Barrier film |
| 9 | DH122-TE-P | DH122 | Thiol-alkene | Plain PET |
| 10 | DH123-TE-B | DH123 | Thiol-alkene | Barrier film |
| 11 | DH123-TE-P | DH123 | Thiol-alkene | Plain PET |
| 12 | DH127-TE-B | DH127 | Thiol-alkene | Barrier film |
| 13 | DH127-TE-P | DH127 | Thiol-alkene | Plain PET |
| 14 | DH130-TE-B | DH130 | Thiol-alkene | Barrier film |
| 15 | DH130-TE-P | DH130 | Thiol-alkene | Plain PET |

External Quantum Efficiency Measurement (EQE):

EQE values were measured using a standardized test procedure with ~3 $cm^2$ area rectangular film sample, a 440 nm excitation wavelength, and an integrating sphere apparatus (obtained under the trade designation "ABSOLUTE PL QUANTUM YIELD SPECTROMETER C11347" from Hamamatsu Quantaurus, Skokie, Ill.). The procedure used software obtained under the trade designation "U6039-05" from Hamamatsu Quantaurus.

Ambient Lit Aging Life Test:

Rectangular ~5 $cm^2$ area samples were cut from film samples of quantum dot materials and placed in contact with the silicone lens of blue LEDs (obtained under the trade designation "LUMILEDS ROYAL BLUE LXML-PRO2" from Lumileds, San Jose, Calif.). The LEDs were well heat-sinked, and operated at 20 mA providing about 25 mW of blue light with a center wavelength of 445 nm. This operating point was a small fraction of the rated current of 700 mA, at which the LEDs were expected to have lifetimes in excess of 50,000 hours to 70% brightness. If the illuminated area of the film was estimated to be 16 $mm^2$, the average blue flux was roughly 160 $mW/cm^2$. The temperature of the quantum dot film was expected to be only slightly above room temperature. The LEDs were operated continuously. The emitted spectrum from each sample (and LED) was acquired periodically with a calibrated integrating sphere, fiber-coupled spectrometer (obtained under the trade designation "FOIS-1" from Ocean Optics, Dunedin, Fla.), and recorded and plotted using software written for that purpose. The spectra were analyzed by calculating the integrated intensity for relevant emission bands (blue: 400-500 nm, green: 500-580 nm, red: 580-700 nm). Test results are provided in Tables 6-8, below.

Unlit Storage Aging Tests at Ambient (~22° C.) and at 85° C.

Rectangular ~5 $cm^2$ area samples were cut from laminated films of quantum dot materials and EQE measurements were performed on them. The samples were then stored in a dark chamber at room temperature (ambient unlit storage aging test) or placed in a constant temperature, precision oven at 85° C. (85° C. unlit storage aging test). After a specified time period, the samples were removed from the oven and their EQE values were measured again. The samples were not exposed to light while they were in the oven at 85° C. Results of the tests are provided in Table 6-8 below.

TABLE 6

| | | Film | | | | |
|---|---|---|---|---|---|---|
| Comp. Example | Initial EQE | EQE change lit aging ~22° C. 750 hours | EQE after storage 6 days ~22° C. | EQE change 6 days ~22° C. | EQE after storage 8 days 85° C. | EQE change 8 days 85° C. |
| A | 98% | −33% | 63% | −36% | 19% | −81% |
| B | 98% | <−2% | 98% | | 84% | −14% |
| C | 84% | −72% | 66% | −22% | 15% | −82% |
| D | 84% | <−2% | 84% | | 78% | −7% |

TABLE 7

| | | Film | | | | |
|---|---|---|---|---|---|---|
| Comp. Example | Initial EQE | EQE change lit aging ~22° C. 1000 hours | EQE after storage 6 days ~22° C. | EQE change 6 days ~22° C. | EQE after storage 8 days 85° C. | EQE change 8 days 85° C. |
| E | 61% | <−2% | 61% | | 60% | −2% |
| F | 61% | <−2% | 52% | −16% | 15% | −70% |
| G | 60% | <−2% | 65% | | 62% | −5% |
| H | 60% | −4% | 52% | −20% | 18% | −66% |
| I | 81% | <−2% | 83% | | 76% | −9% |
| J | 81% | −7% | 67% | −19%% | 21% | −69% |
| K | 74% | <−2% | 75% | | 61% | −19% |
| L | 74% | <−2% | 66% | −12% | 21% | −69% |
| M | 70% | <−2% | 70% | | 65% | −8% |
| O | 70% | <−2% | 59% | −16% | 18% | −69% |

TABLE 8

| | | Film | | | | |
|---|---|---|---|---|---|---|
| Example | Initial EQE | EQE change lit aging ~22° C. 1000 hours | EQE after storage 6 days ~22° C. | EQE change 6 days ~22° C. | EQE after storage 8 days 85° C. | EQE change 8 days 85° C. |
| 6 | 60% | <−2% | 60% | | 66% | 10% |
| 7 | 60% | <−2% | 62% | 3% | 54% | −13% |
| 8 | 60% | <−2% | 60% | | 68% | 12% |
| 9 | 60% | −5% | 64% | 6% | 46% | −28% |
| 10 | 81% | <−2% | 81% | | 87% | 8% |
| 11 | 81% | −4% | 83% | 3% | 61% | −27% |
| 12 | 74% | <−2% | 74% | | 80% | 8% |
| 13 | 74% | <−2% | 74% | 0% | 70% | −6% |
| 14 | 68% | <−2% | 68% | | 76% | 11% |
| 15 | 68% | <−2% | 69% | 1% | 60% | −13% |

Foreseeable modifications and alterations of this disclosure will be apparent to those skilled in the art without departing from the scope and spirit of this invention. This invention should not be restricted to the embodiments that are set forth in this application for illustrative purposes.

What is claimed is:

1. A curable composition comprising at least one tri-thiol having an isocyanurate group, at least one tri-alkene having an isocyanurate group, and particles, wherein the particles comprise a composite core and a continuous nonmetallic inorganic coating covering the composite core, wherein the composite core comprises a nonmetallic inorganic matrix, quantum dots, and ligands bound to the quantum dots, wherein the nonmetallic inorganic matrix is present in the composite core in an amount of 5 to 40 volume percent, and wherein the coating has an average thickness up to 5 micrometers.

2. An article comprising particles in an organic polymer matrix comprising a cured thiol-alkene resin having a $T_g$ greater than 20° C., wherein the particles comprise a composite core and a continuous nonmetallic inorganic coating covering the composite core, wherein the composite core comprises a nonmetallic inorganic matrix, quantum dots, and ligands bound to the quantum dots, wherein the nonmetallic inorganic matrix is present in the composite core in an amount of 5 to 40 volume percent, wherein the coating has an average thickness up to 5 micrometers and wherein the cured thiol-alkene resin comprises the reaction product of at least one tri-thiol having an isocyanurate group and at least tri-alkene having an isocyanurate group.

3. The article of claim 1, wherein the nonmetallic inorganic matrix comprises at least one of silica or metal oxide.

4. The article of claim 1, wherein collectively the ligands and the quantum dots are present in the composite core in an amount of at least 60 volume percent.

5. The article of claim 1, wherein the nonmetallic inorganic matrix is aerogel.

6. The article of claim 1, wherein the nonmetallic inorganic matrix is chromatography media.

7. The article of claim 1, wherein the composite core further comprises a liquid.

8. The article of claim 7, wherein the liquid is a nonvolatile.

9. The article of claim 7, wherein greater than 50 volume percent of the composite core is collectively the liquid, the ligands, and the quantum dots.

10. The article of claim 1, wherein the ligands include at least one of an aminosilicone or a carboxylic acid functional polymer.

11. The article of claim 1, wherein the quantum dots comprise CdSe or InP nanoparticles.

12. The article of claim 1, wherein the composite core comprises a mesoporous structure.

13. The article of claim 1, wherein the particle has air stable light emission properties.

14. The article of claim 1, wherein the stoichiometric ratio of thiol groups of the tri-thiol to alkene groups of the tri-alkene is 1.2:1 to 1:1.2.

* * * * *